US012665035B2

(12) United States Patent
Li et al.

(10) Patent No.: US 12,665,035 B2
(45) Date of Patent: Jun. 23, 2026

(54) MEMORY DEVICES AND OPERATING METHODS THEREOF, MEMORY SYSTEMS, AND ELECTRONIC DEVICES

(71) Applicant: Yangtze Memory Technologies Co., Ltd., Wuhan (CN)

(72) Inventors: Jianjie Li, Wuhan (CN); Yue Sheng, Wuhan (CN); Weijun Wan, Wuhan (CN); Ke Liang, Wuhan (CN); Qianqian Shi, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 127 days.

(21) Appl. No.: 18/816,921

(22) Filed: Aug. 27, 2024

(65) Prior Publication Data

US 2025/0349367 A1 Nov. 13, 2025

(30) Foreign Application Priority Data

May 8, 2024 (CN) .......................... 202410565037.2

(51) Int. Cl.
| | |
|---|---|
| *G11C 16/04* | (2006.01) |
| *G11C 16/08* | (2006.01) |
| *G11C 16/26* | (2006.01) |

(52) U.S. Cl.
CPC .......... *G11C 16/26* (2013.01); *G11C 16/0483* (2013.01); *G11C 16/08* (2013.01)

(58) Field of Classification Search
CPC ...... G11C 16/26; G11C 16/0483; G11C 16/08
See application file for complete search history.

(56) References Cited

U.S. PATENT DOCUMENTS

| | | | |
|---|---|---|---|
| 12,106,807 B2 * | 10/2024 | Guo ...................... | G11C 16/08 |
| 2011/0267894 A1 * | 11/2011 | Choi ..................... | G11C 16/08 |
| | | | 365/185.25 |
| 2012/0008389 A1 * | 1/2012 | Kim ................... | G11C 11/5642 |
| | | | 365/185.18 |
| 2025/0356926 A1 * | 11/2025 | Wang ................. | G11C 16/0483 |
| 2026/0013135 A1 * | 1/2026 | Kwak ................... | H10B 43/27 |

* cited by examiner

*Primary Examiner* — Min Huang
(74) *Attorney, Agent, or Firm* — Hanley, Flight & Zimmerman, LLC

(57) ABSTRACT

Examples of the present disclosure provide a memory device and an operating method thereof, a memory system, and an electronic device. The memory device comprises: a memory cell array; and peripheral circuit coupled to the memory cell array through word lines and bit lines and configured to: apply a first read voltage to a selected word line; charge the sense nodes corresponding to the memory cells coupled to the selected word line; divide the memory cells coupled to the selected word line into multiple memory cell groups to perform sensing operations, and the sensing operation includes: controlling the multiple sense nodes corresponding to the multiple memory cells in the memory cell group to discharge twice; and obtain a first counted number of each memory cell group based on each discharge result of the multiple sense nodes corresponding to each memory cell group.

20 Claims, 20 Drawing Sheets

10

62

91

MEMORY DEVICES AND OPERATING METHODS THEREOF, MEMORY SYSTEMS, AND ELECTRONIC DEVICES

CROSS-REFERENCE TO RELATED APPLICATION

This application claims priority to and the benefit of Chinese Patent Application 202410565037.2, filed on May 8, 2024, which is hereby incorporated by reference in its entirety.

FIELD OF TECHNOLOGY

The present disclosure relates to the field of semiconductor technology, and in particular to a memory devices and operating methods thereof, memory systems and electronic devices.

BACKGROUND

With the continuous development of science and technology today, semiconductor memory device is widely used in various electronic devices and electronic products. For example, NAND memory device, as a non-volatile memory device, is a commonly used semiconductor memory device in computers.

DETAILED DESCRIPTION

In order to make the purpose, technical solutions and advantages of the present disclosure clear, the present disclosure will be further described in detail below in conjunction with the accompanying drawings, the described examples should not be regarded as limiting the present disclosure, and all other examples obtained by those skilled in the art without making creative efforts belong to the claimed scope of the present disclosure.

In the following description, "some examples" are referred to, which describe a subset of all possible examples, but it is to be understood that "some examples" may be the same subset or different subsets of all possible examples, and may be combined with each other without conflict.

In the following description, the terms "first\second\third" referred to are only employed to distinguish similar objects, and do not represent a particular order for the objects, and it is to be understood that "first\second\third" may interchange the particular order or sequence where permitted, so that examples of the present disclosure described herein may be implemented in an order other than that illustrated or described herein.

It should be noted that, in this description, the terms "comprising", "containing" or any other variations thereof are intended to cover a non-exclusive inclusion, such that a process, method, article or apparatus that comprises a series of elements comprises not only those elements but also other elements not expressly listed or that are inherent to the process, method, article or apparatus. Without further limitation, an element defined by the statement "comprising a . . ." does not exclude the presence of additional identical elements in a process, method, article, or apparatus that comprises that element.

Unless otherwise defined, all technical and scientific terms used herein have the same meaning as commonly understood by those skilled in the art to which the present disclosure belongs. The terminology used herein is only for the purpose of describing examples of the disclosure and is not intended to limit the disclosure.

Figure 1A:
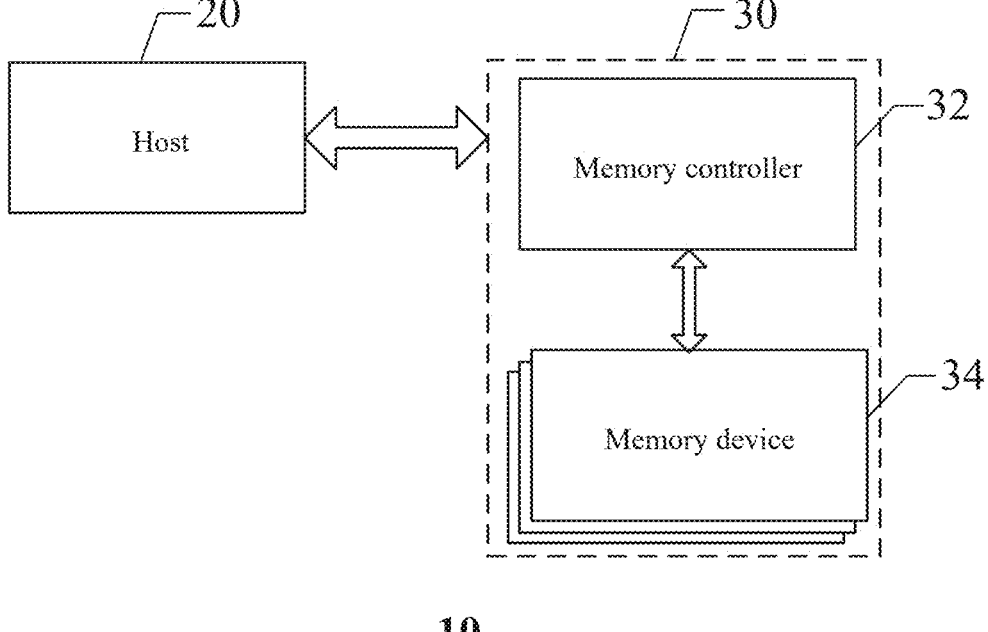
FIG. 1A is a schematic diagram of an electronic device comprising a memory device provided in examples of the present disclosure.

FIG. 1A is a block diagram of an electronic device comprising a memory device provided in examples of the present disclosure. The electronic device 10 may comprise a host 20 and a memory system 30. The electronic device 10 may comprise, but is not limited to a mobile phone, a desktop computer, a laptop computer, a tablet computer, a vehicle computer, a gaming console, a printer, a positioning device, a wearable electronic device, a smart sensor, a Virtual Reality (VR) device, an Augmented Reality (AR) device, or any other suitable electronic devices having memory device 34 therein; and the host 20 may be a processor of an electronic device (e.g., a Central Processing Unit (CPU)) or a System on Chip (SoC) (e.g., an Application Process (AP)).

In an example of the present disclosure, the host 20 may be configured to send data to or receive data from the memory system 30. Here, the memory system 30 may comprise a memory controller 32 and one or more memory devices 34. The memory device 34 may comprise but is not limited to NAND Flash Memory, Vertical NAND Flash Memory, NOR Flash Memory, Dynamic Random Access Memory (DRAM), Ferroelectric Random Access Memory (FRAM), Magnetoresistive Random Access Memory (MRAM), Phase Change Random Access Memory (PCRAM), Resistive Random Access Memory (RRAM) and Nano Random Access Memory (NRAM), etc.

In an example of the present disclosure, a memory controller 32 may be coupled to the memory device 34 and the host 20 and be configured to control the memory device 34. In an example, the memory controller 32 may be designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc. In some examples, the memory controller 32 may be also designed to operate in high duty cycle environments such as Solid State Disk (SSD) or embedded Multi-Media Card (MMC), and SSDs or eMMCs may be used as data memory for mobile devices such as smartphone, tablet computer, laptop computer, and enterprise memory array.

Further, the memory controller 32 may manage data in the memory device 34 and communicate with the host 20. The memory controller 32 may be configured to control operations such as read, erase, program, and etc. of the memory device 34; and may also be configured to manage various functions related to data stored or to be stored in the memory device 34, comprising but not limited to bad block management, garbage collection, logical-to-physical address translation, wear leveling, etc.; and may also be configured to process Error Checking and Correction (ECC) on data read from or written to the memory device 34. In addition, the memory controller 32 may also perform any other suitable functions, e.g., formatting the memory device 34, or communicating with external devices (e.g., the host 20 in FIG. 1) according to a particular communication protocol. In an example, the memory controller 32 may also communicate with an external host through at least one of various interface protocols, such as USB protocol, MMC protocol, Peripheral Component Interconnect (PCI) protocol, Peripheral Component Interconnect Express (PCI-E) protocol, Advanced Technology Attachment (ATA) protocol, Serial ATA protocol, Parallel ATA protocol, Small Computer System Interface (SCSI) protocol, Enhanced Small Disk Interface (ESDI) protocol, Integrated Drive Electronics (IDE) protocol, Firewire protocol, etc.

Figure 1B:
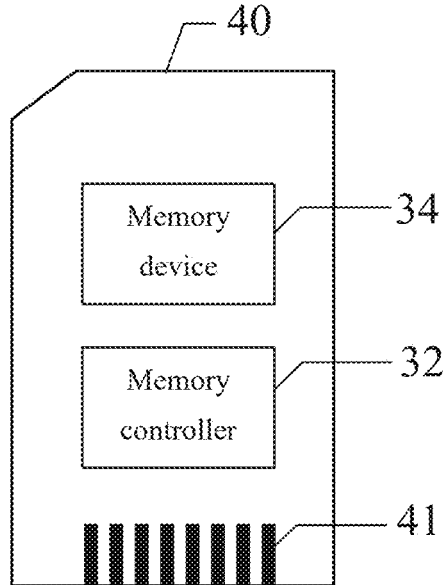
FIG. 1B is a schematic diagram of a memory card comprising a memory device provided in examples of the present disclosure.
Figure 1C:
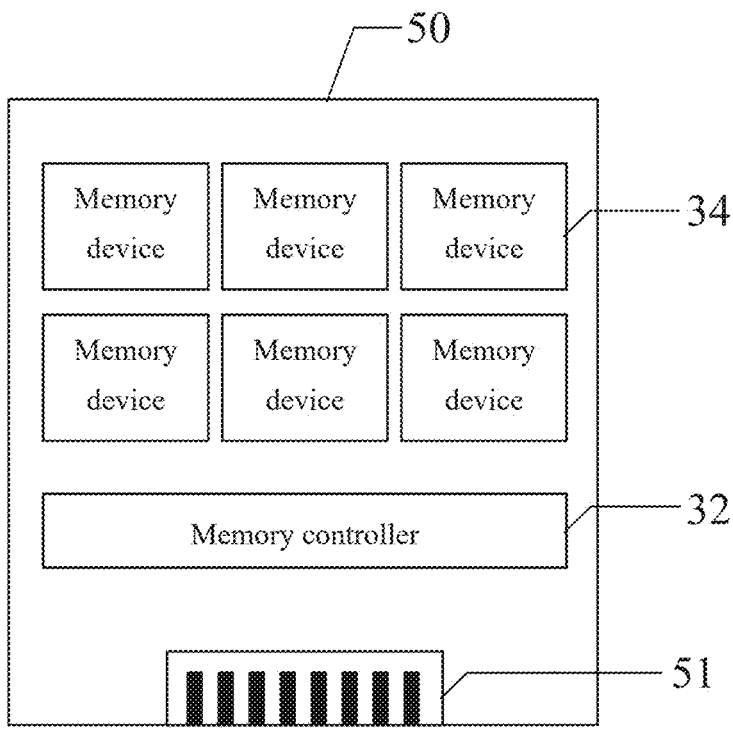
FIG. 1C is a schematic diagram of solid-state drive comprising memory device provided in examples of the present disclosure.

In an example of the present disclosure, the memory controller 32 and one or more memory devices 34 may be integrated into various types of memory devices, e.g., comprised in a same package (e.g., Universal Flash Storage (UFS) package or eMMC package). That is, the memory system 30 may be implemented and packaged into different types of end electronic products. As shown in FIG. 1B, a memory controller 32 and a single memory device 34 may be integrated together to form a memory card 40. The memory card 40 may comprise a PC card (Personal Computer Memory Card International Association), a CF card, a Smart Media (SM) card, a memory stick, a Multimedia card (MMC (Multi-Media Card), RS-MMC (Reduced-Size MMC), MMCmicro), a SD card (SD, miniSD, microSD, Secure Digital High Capacity (SDHC)), UFS, etc. The memory card 40 may further comprise a memory card connector 41 coupling memory card 40 with a host (e.g., the host 20 in FIG. 1). In another example as shown in FIG. 1C, the memory controller 32 and the plurality of memory devices 34 may be integrated together to form an SSD 50. The SSD 50 may further comprise an SSD connector 51 coupling SSD 220 with a host (e.g., the host 110 in FIG. 1). In some implementations, the storage capacity and/or operating speed of the SSD 50 is greater than the storage capacity and/or operating speed of the memory card 40.

Figure 1D:
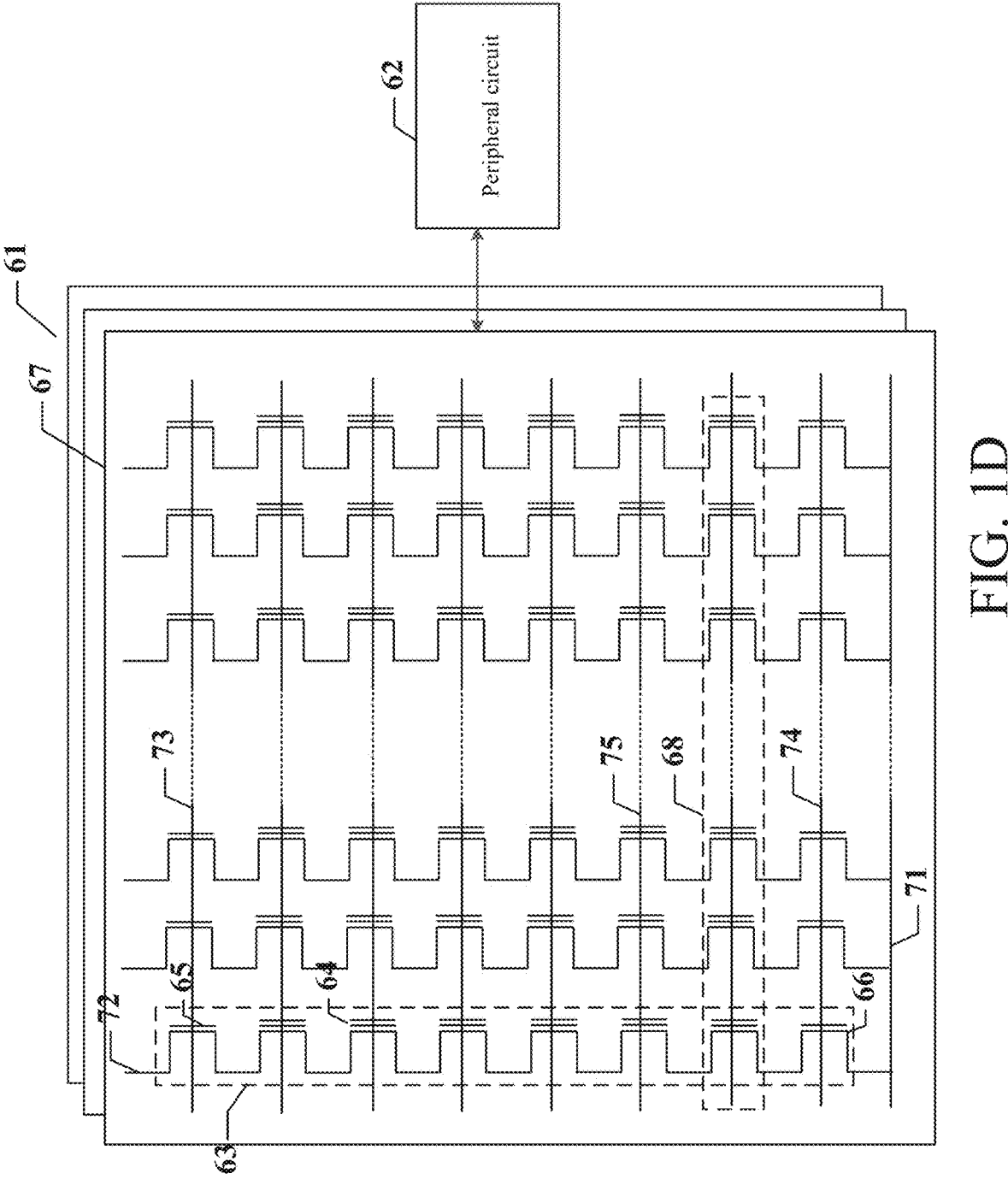
FIG. 1D is a schematic diagram of a memory device comprising peripheral circuit provided in examples of the present disclosure.

FIG. 1D is a schematic diagram of a memory device comprising peripheral circuit provided in examples of the present disclosure, wherein the memory device may be the memory device 34 in any one of FIGS. 1a to 1c. As shown in FIG. 1D, the memory device may comprise a memory cell array 61 and peripheral circuit 62 coupled to the memory cell array 61, etc. Here, the memory cell array 61 may be a NAND flash memory cell array, wherein the memory cell array 61 is arranged in the form of a memory string array, and each memory string 63 extends vertically above the substrate. In some examples, each memory string 63 may comprise multiple memory cells 64 coupled in series and stacked vertically, wherein each memory cell 64 may retain a continuous analog value, e.g., voltage or charge, depending on the number of electrons trapped within the area of the memory cell. Additionally, each memory cell 64 in the memory cell array 61 may be a floating gate type memory cell comprising a floating gate transistor, or a charge trap type memory cell comprising a charge trap transistor.

As shown in FIG. 1D, each memory string 63 may comprise a bottom select transistor 66 at its source terminal and a top select transistor 65 at its drain terminal. The bottom select transistor 66 and the top select transistor 65 may be configured to activate a selected NAND memory string 63 (a column of an array) during read operation and program operation.

In some implementations, sources of the NAND memory string 63 in a same memory block (briefly referred to as "block") 67 are coupled through a same Source Line (SL) 71 (e.g., a common SL). In other words, according to some implementations, all memory strings 63 in a same block 67 have an Array Common Source (ACS). According to some implementations, the top select transistor 65 of each memory string 63 is coupled to a respective bit line 72 from or to which data may be read or written via an output bus (not shown).

In some implementations, each memory string 308 is configured to be selected or deselected by applying a select voltage (e.g., higher than the threshold voltage of the top select transistor 65) or a deselect voltage (e.g., 0 V) to the gate of the respective top select transistor 65 via one or more top select gate (TSG) lines 73; and/or to be selected or deselected by applying a select voltage (e.g., higher than the threshold voltage of the bottom select transistor 66) or a deselect voltage (e.g., OV) to the gate of the respective bottom select transistor 66 via one or more bottom select gate (BSG) lines 74. The memory string 63 may therefore be distinguished as a selected memory string or a non-selected memory string.

As also shown in FIG. 1D, the memory string 63 may be organized into multiple blocks 67 each of which may have a common source line 71 (e.g., coupled to ground). In some examples, each block 67 is the basic data unit for an erase operation, i.e., all memory cells 64 on a same block 67 are erased simultaneously. To erase the memory cell 64 in the selected block, source line 71 coupled to the selected block and to the unselected blocks in the same plane as the selected block may be biased with an erase voltage (Vers) (e.g., a high positive voltage (e.g., 20V or higher)). It is to be understood that, in some examples, erase operations may be performed at the half-block level, at the quarter-block level, or at a level with any suitable number of blocks or any suitable fraction of blocks.

The memory cells 64 of adjacent memory strings 63 may be coupled through a word line 75 that selects which row of the memory cells 64 is affected by read and program operations. In some examples, each word line 75 is coupled to the page 68 to which the memory cell 64 belongs, wherein the page 68 is the basic data unit for a program operation. The size of one page 68 in bits may be related to the number of memory strings 63 coupled through word line 75 in a block 67. Each word line 75 may comprise multiple control gates (gate electrodes) at each memory cell 64 in a corresponding page 68 and a gate line coupling the control gates.

Figure 1E:
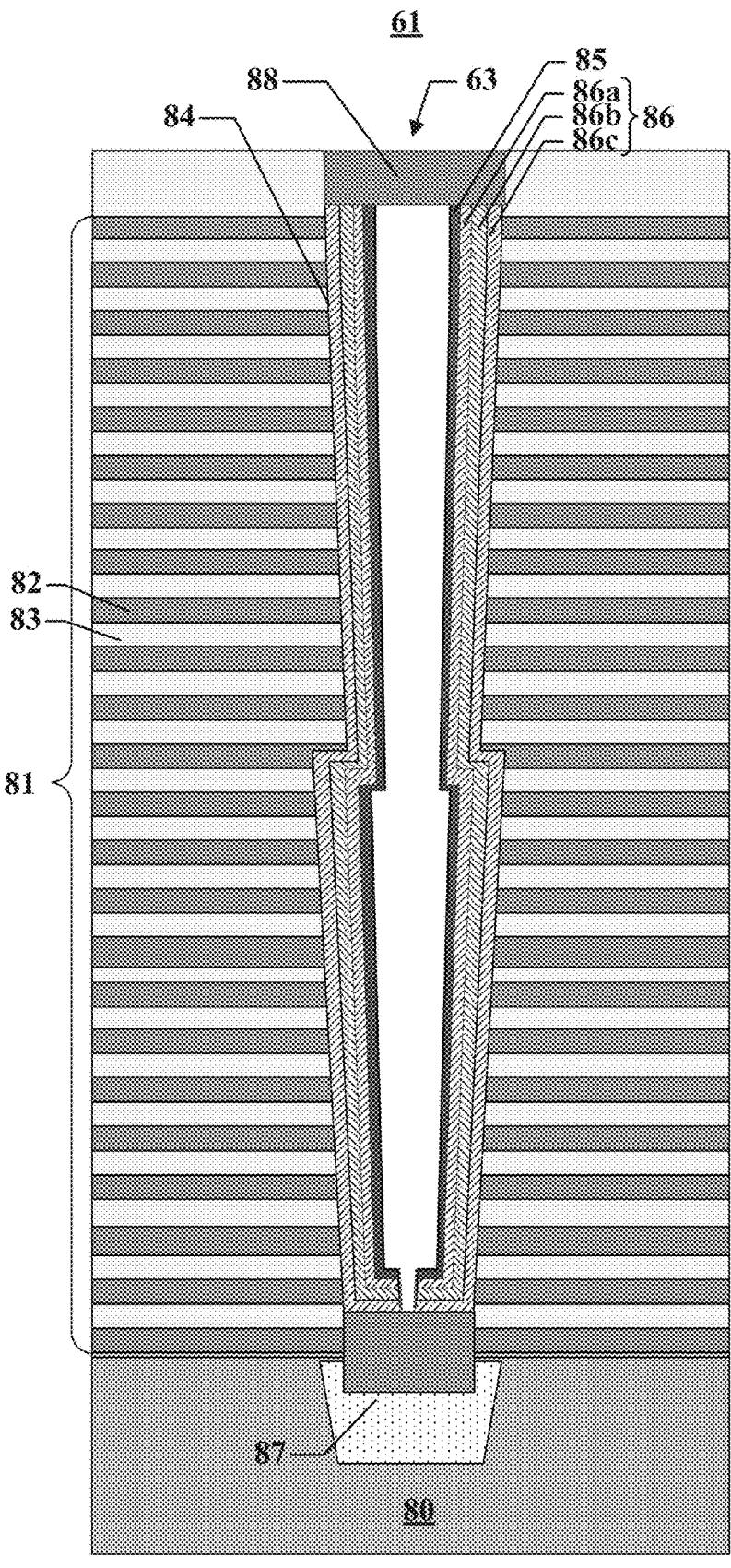
FIG. 1E is a schematic structural diagram of a memory cell array comprising memory strings provided in examples of the present disclosure.

FIG. 1E is a schematic diagram of a memory cell array comprising memory strings provided in examples of the present disclosure. As shown in FIG. 1E, the memory string 63 may extend vertically above the substrate 80 and through the stacked layers 81. The stacked layer 81 may comprise alternating gate conductive layers 82 and dielectric layers 83, wherein the number of pairs of the gate conductive layers 82 and the dielectric layers 83 may determine the number of memory cells 64 in the memory cell array 61. The gate conductive layer 82 may extend laterally at the top of the memory stack 81 as a top select gate line 73, extend laterally at the bottom of the stack 81 as a bottom select gate line 74, or extend laterally between the top select gate line 73 and the bottom select gate line 74 as a word line 75. It is to be understood that although one bottom select gate line 74 and one top select gate line 73 are shown in FIG. 1D, the number of bottom select gate lines 74 and the number of top select gate lines 73 (and the number of bottom select transistor 66 and top select transistor 65 coupled to the bottom select gate line 74 and the top select gate line 73 respectively) may vary in other examples.

As shown in FIG. 1E, the memory string 63 comprises a channel structure 84 extending vertically through the stacked layer 81. In some implementations, the channel structure 84 comprises channel 85 and memory film 86. In some examples, the material of channel 85 is a semiconductor material, comprising silicon, e.g., polysilicon. In some implementations, the memory film 86 is a composite dielectric layer comprising a tunneling layer 86a, a storage layer 86b (also referred to as a "charge trapping layer"), and a blocking layer 86c. The channel structure 84 may have a pillar shape (e.g., a cylindrical shape). According to some implementations, the channel 85, tunneling layer 86a, storage layer 86b and blocking layer 86c are radially arranged in this order from the center of the pillar toward the outer surface of the pillar. The tunneling layer 86a may comprise silicon oxide, silicon oxynitride, or any combination thereof. The storage layer 86b may comprise silicon nitride, silicon oxynitride, or any combination thereof. The blocking layer 86c may comprise silicon oxide, silicon oxynitride, a high dielectric constant (high-k) dielectric, or any combination thereof. In an example, the memory film 86 may comprise a composite layer of silicon oxide/silicon oxynitride/silicon oxide (ONO).

In some examples, as shown in FIG. 1E, a well 87 (e.g., a P-well and/or an N-well) may be formed in the substrate 80, and the source terminal of the memory string 63 contacts the well 87. For example, the source line 71 may be coupled to the well 87 to apply an erase voltage to the well 87 (i.e., the source of the memory string 63) during an erase operation. In some implementations, the memory string 63 further comprises a channel plug 88 at the drain terminal of the memory string 63, e.g., as part of the drain of the memory string 63. It is to be understood that the structure of the channel structure 84 depicted in FIG. 1E is for illustration purposes only and may vary in other examples. It is to be understood that although not shown in FIG. 1E, additional components of the memory cell array 61 may be formed, the additional components comprising but not limited to gate line gaps/source contacts, local contacts, interconnection layers, etc.

Figure 1F:
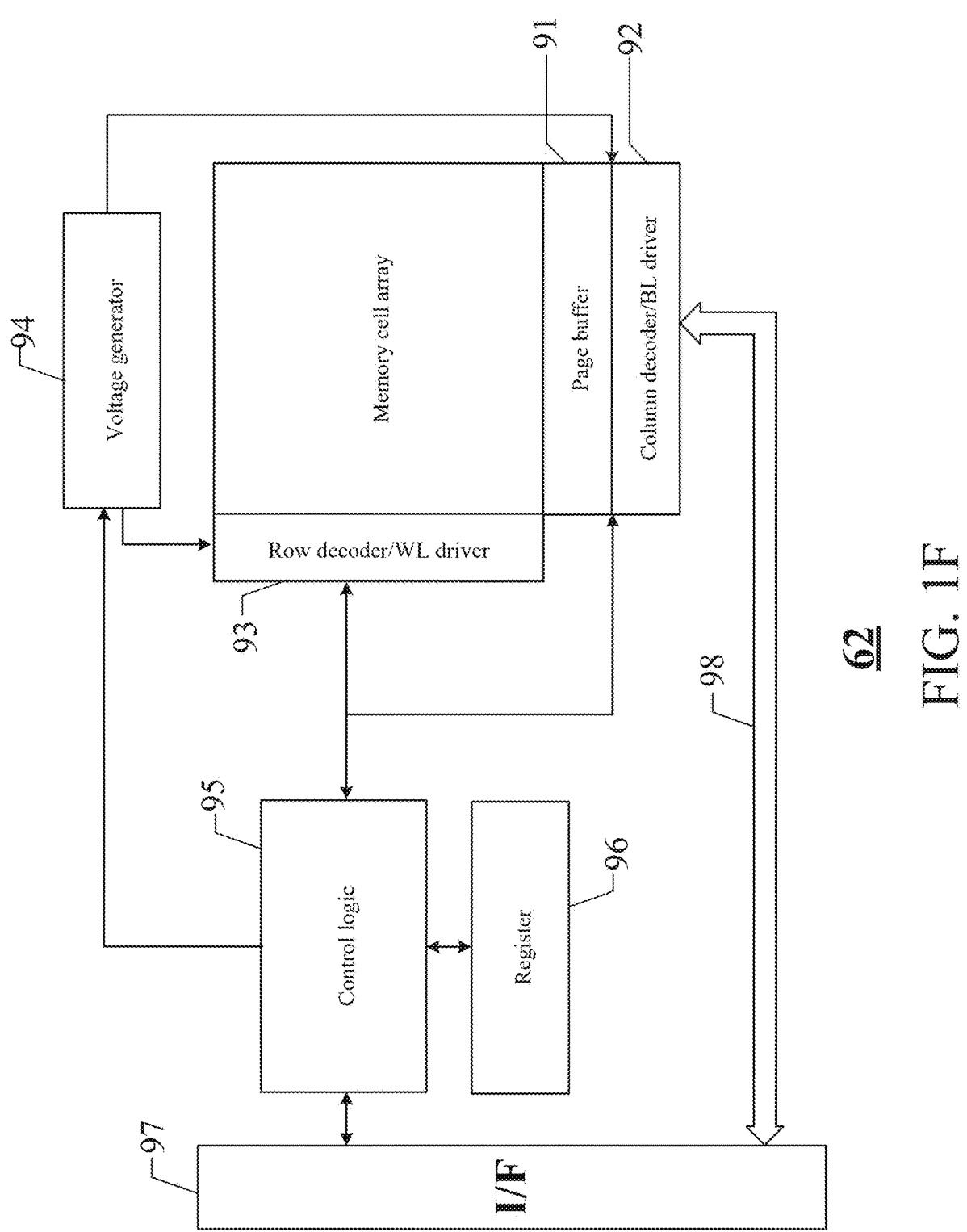
FIG. 1F is a schematic diagram of a peripheral circuit provided in examples of the present disclosure.

Referring back to FIG. 1D, peripheral circuit 62 may be coupled to memory cell array 61 through the bit line 72, word line 75, source line 71, bottom select line 74, and top select line 73. The peripheral circuit 62 may comprise any suitable analog, digital, and mixed-signal circuitry for implementing write and read operation of the memory cell array 61 by applying at least one of a voltage signal or a current signal to and sensing at least one of a voltage signal or a current signal from each target memory cell 64 via bit line 72, word line 75, source line 71, bottom select line 74, and top select line 73. The peripheral circuit 62 may comprise various types of peripheral circuits formed with metal-oxide-semiconductor (MOS) technology. For example, FIG. 1F is a schematic diagram of a peripheral circuit provided in examples of the present disclosure, and the peripheral circuit 62 comprises a page buffer 91, a column decoder/BL driver 92, a row decoder/WL driver 93, a voltage generator 94, a control logic 95, a register 96, an interface (I/F) 97, and a data bus 98. It is to be understood that in some examples, additional peripheral circuits not shown in FIG. 1F may also be comprised.

The page buffer 91 may be configured to read data from and program (write) data to the memory cell array 61 according to control signals from the control logic 95.

The column decoder/BL driver 92 may be configured to be controlled by the control logic 95 and to select one or more NAND memory strings 63 by applying a bit line voltage generated from voltage generator 94.

The row decoder/WL driver 93 may be configured to be controlled by the control logic 95 and select/deselect blocks 67 of the memory cell array 61 according to the control signals generated by the control logic, and select/deselect word line 75 of the blocks 67. The row decoder/WL driver 93 may also be configured to drive word line 75 with different word line voltages generated from voltage generator 94.

The control logic 95 may be coupled to each of the peripheral circuits described above and configured to control operations of each of the peripheral circuits. The register 96 may be coupled to the control logic 95 and comprise status register, command register and address register for storing status information, command operation code and command address for controlling operations of the peripheral circuits. In some examples, the control logic 95 may receive a program command issued by a memory controller (e.g., the memory controller 32 in FIG. 1) and send control signals to various peripheral circuit parts to perform read operation, program operation, and erase operation, etc.

The interface 97 may be coupled to the control logic 95 and act as a buffer to buffer a control command (e.g., program command) received from a memory controller or a host and relay them to the control logic 95, and to buffer status information received from the control logic 95 and relay them to the memory controller or the host.

Figure 2:
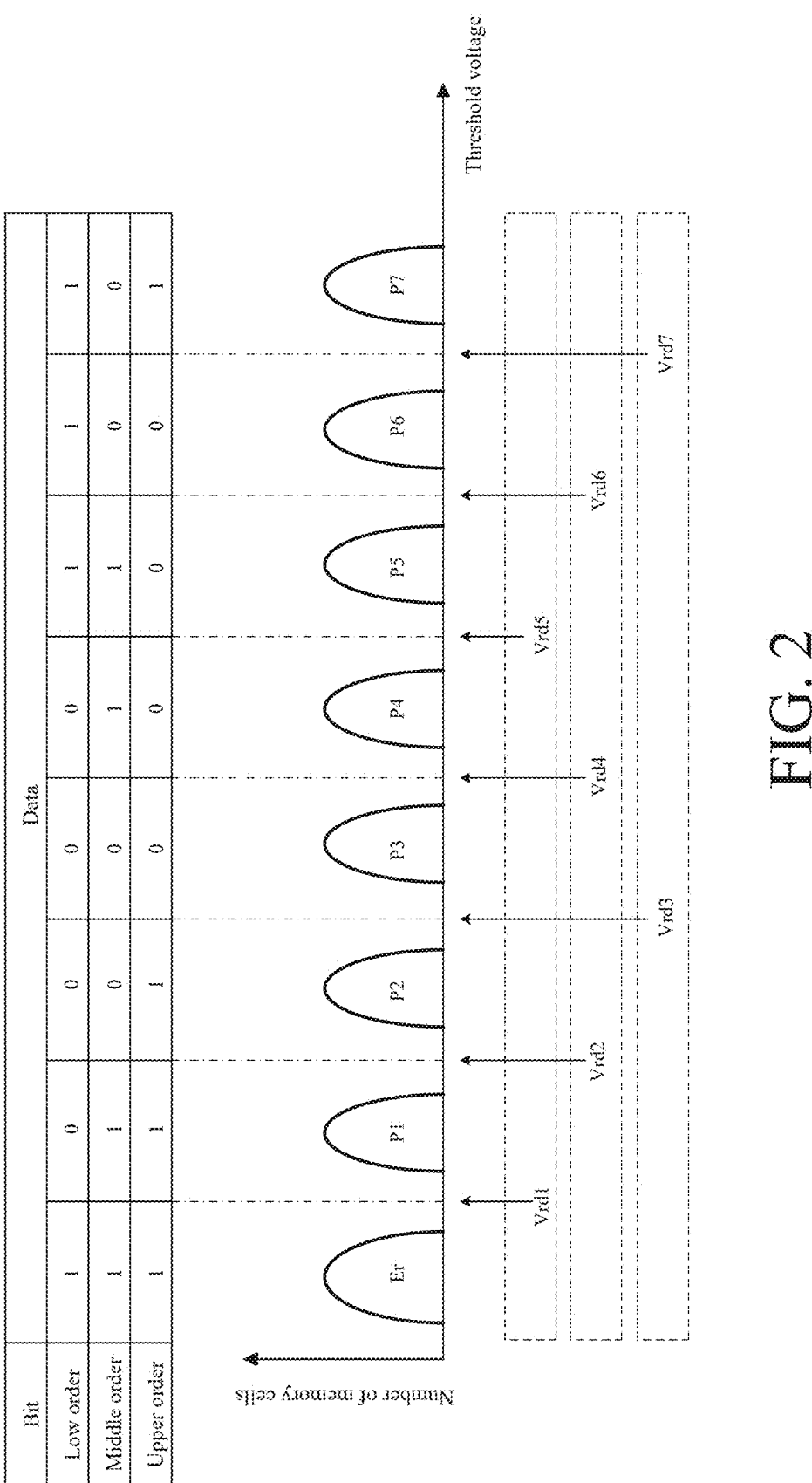
FIG. 2 is a schematic diagram of a threshold voltage distribution of a memory cell provided in examples of the present disclosure.

FIG. 2 is a schematic diagram of a threshold voltage distribution of a memory cell provided in examples of the present disclosure. The memory cell may store greater than 2 bits (also referred to as more than 2 bits) of data. For example, MLC (Multi-Level Cell) can store 2 bits of data, TLC (Triple-Level Cell) can store 3 bits of data, and QLC (Quad-Level Cell) can store 4 bits of data. In this example, take the case where the memory cell stores 3 bits of data, namely the so-called TLC as an example for explanation.

The 3-bit data consists of a lower bit, a middle bit, and an upper bit. If the upper bit is set to "X", the middle bit is set to "Y", and the lower bit is set to "Z", the 3-bit data may be represented as "XYZ". In the case where the memory cell stores 3 bits of data, the memory cell may be in any of the 8 states corresponding to the threshold voltage. The 8 states are referred to as states "Er", "P1", "P2", "P3", "P4", "P5", "P6" and "P7" from low to high. The eight states may be assigned data "111", "110", "100", "000", "010", "011", "001", and "101". The correspondence between the state of the threshold voltage distribution and the data may be set arbitrarily, which will not be restricted by the present disclosure. FIG. 2 illustrates one of the correspondences, in an example, the states of "Er", "P1", "P2", "P3", "P4", "P5", "P6" and "P7" correspond to the data "111", "110", "100", "000", "010", "011", "001", and "101" respectively.

In a state, not all memory cells have the same threshold voltage. In fact, the threshold voltages of all memory cells in a state will be presented as a probability distribution. Multiple states correspond to multiple relatively independent probability distributions, and there is a valley between two adjacent probability distributions. The state to which the threshold voltage of the memory cell belongs may be determined to read the data in the memory cell. The read voltages Vrd1, Vrd2, Vrd3, Vrd4, Vrd5, Vrd6, and Vrd7 are employed to perform the read operation to determine the state, wherein the read voltages are located in multiple valleys in the threshold voltage distribution curve.

The state "Er" is, e.g., an erase state in which data is erased. The threshold voltage of the memory cell belonging to the state "Er" is lower than the read voltage Vrd1. States "P1" to "P7" are, e.g., non-erased states (also referred to as program states) in which charge is injected into the charge storage layer to write data into the memory cell. The threshold voltage of the memory cell belonging to state "P1" is higher than the read voltage Vrd1 and lower than the read voltage Vrd2. The threshold voltage of the memory cell belonging to state "P2" is higher than the read voltage Vrd2 and lower than the read voltage Vrd3. Similarly, the threshold voltage of the memory cell belonging to state "P7" is higher than the read voltage Vrd7.

As shown in FIG. 2, each memory cell is configured to store 3 bits of data in one of 8 states. It may be determined whether the low-order bit in the memory cell is data "1" or data "0" by using two read voltages Vrd1 and Vrd5 for read operation. It may be determined whether the middle-order bit in the memory cell is data "1" or data "O" by using three read voltages Vrd2, Vrd4, and Vrd6 for read operation. It may be determined whether the upper-order bit in the memory cell is data "1" or data "0" by using two read voltages Vrd3 and Vrd7 for read operation. That is, 7 read operations using 7 read voltages are performed on the selected page, thereby determining the 3-bit data stored in the memory cell.

However, the memory cell may lose charge over time, that is, retain charge loss. Due to the retained charge loss, the threshold voltage distribution of the memory cell may shift over time. For example, the retained charge loss may cause the threshold voltage of the memory cell to decrease, thereby causing the threshold voltage distribution corresponding to the non-erased state to move to the negative direction (i.e., the left side in FIG. 2). As a result, the initialization read voltage set based on the threshold voltage distribution of the memory cell obtained, e.g., from chip testing after manufacturing may no longer be at the valley value of the two shifted threshold voltage distributions, and thus, the read error in the read operation may increase.

If the accuracy of the read operation is to be improved, it is required to first find the valley value between adjacent threshold voltage distributions. One method for determining the valley value between adjacent threshold voltage distributions is Automatic Valley Detection (AVD). The AVD algorithm needs to balance accuracy and algorithm time, and one of the current mainstream AVD algorithms is the BL modulation method.

Figure 3A:
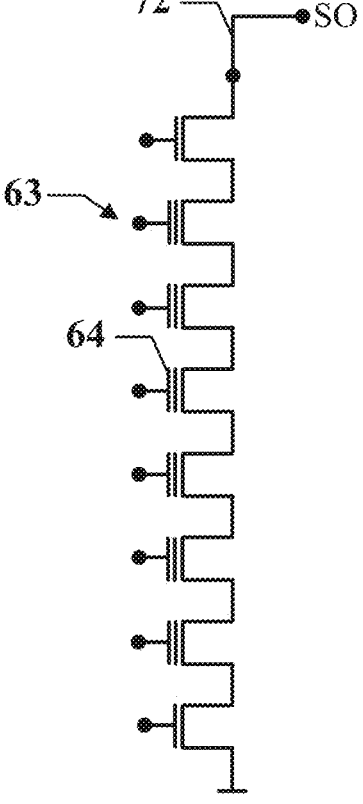
FIG. 3a is a schematic diagram of a memory cell and a sense node provided in examples of the present disclosure.
Figure 3B:
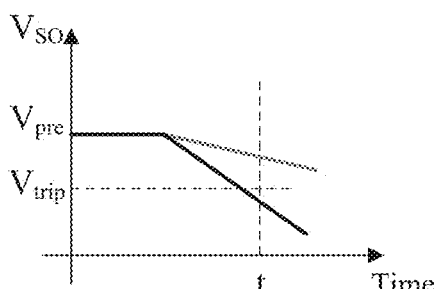
FIG. 3b is a schematic diagram of the change of the voltage $V_{SO}$ of the sense node SO over time.

Before describing the method of using BL modulation to detect the valley value of the threshold voltage distribution, this description first introduces a read operation process. FIG. 3$a$ is a schematic diagram of a memory cell and a sense node provided in examples of the present disclosure, FIG. 3$b$ is a schematic diagram of the change of the voltage $V_{SO}$ of the sense node SO over time. Referring to FIG. 1F and FIG. 3$a$, the sense node SO of the page buffer 91 is coupled to a memory string 63 through the bit line 72. When performing a read operation, the row decoder/WL driver 93 applies a read voltage (any read voltage from Vrd1 to Vrd7) to the selected word line among the multiple word lines, and the page buffer 91 first charges the sense node and the bit line 72, and then controls the sense node to discharge through the bit line 72 and the channel of the memory string 63.

Referring to FIG. 3$b$, the sense node SO is first charged to a preset voltage $V_{pre}$, and then gradually discharges, wherein the sense node discharges at different rates based on the different threshold voltages of the to-be-read memory cells 64. Taking the application of the read voltage Vrd1 as an example, if the threshold voltage of the to-be-read memory cell is in the threshold voltage distribution corresponding to the Er state, then the to-be-read memory cell is on, such that the discharge rate of the sense node SO is fast, and its discharge curve may correspond to the black solid line with a larger slope in FIG. 3$b$. If the threshold voltage of the to-be-read memory cell 64 is in the threshold voltage distribution corresponding to the P0 state, the to-be-read memory cell is weakly on or off, such that the discharge rate of the sense node SO is slow, and its amplification curve may correspond to the gray solid line with a small slope in FIG. 3$b$.

After the sense node discharges for a period of time, through comparing the magnitude of the voltage of the sense node SO and the trip voltage Vtrip, it may be inferred whether the memory cell is on or off. In an example, if the voltage of the sense node is less than the trip voltage Vtrip, the memory cell is determined to be on (Cell on), and if the voltage of the sense node is greater than the trip voltage Vtrip, the memory cell is determined to be off (Cell off).

The discharge time duration of the sense node in the read operation is referred to as sensing time duration. The setting of the sensing time duration will affect the state determination for the memory cell. When the read voltage is constant, if the sensing time duration is too long, some memory cells may be misjudged as on, that is, these memory cells are misjudged as being in the threshold voltage distribution on the left side of the valley value. If the sensing time duration is too short, some memory cells may be misjudged as off, that is, these memory cells are misjudged as being in the threshold voltage distribution on the right side of the valley value. The threshold voltage distribution to which the memory cell belongs may only be able to correctly determined with a suitable sensing time.

Figure 4:
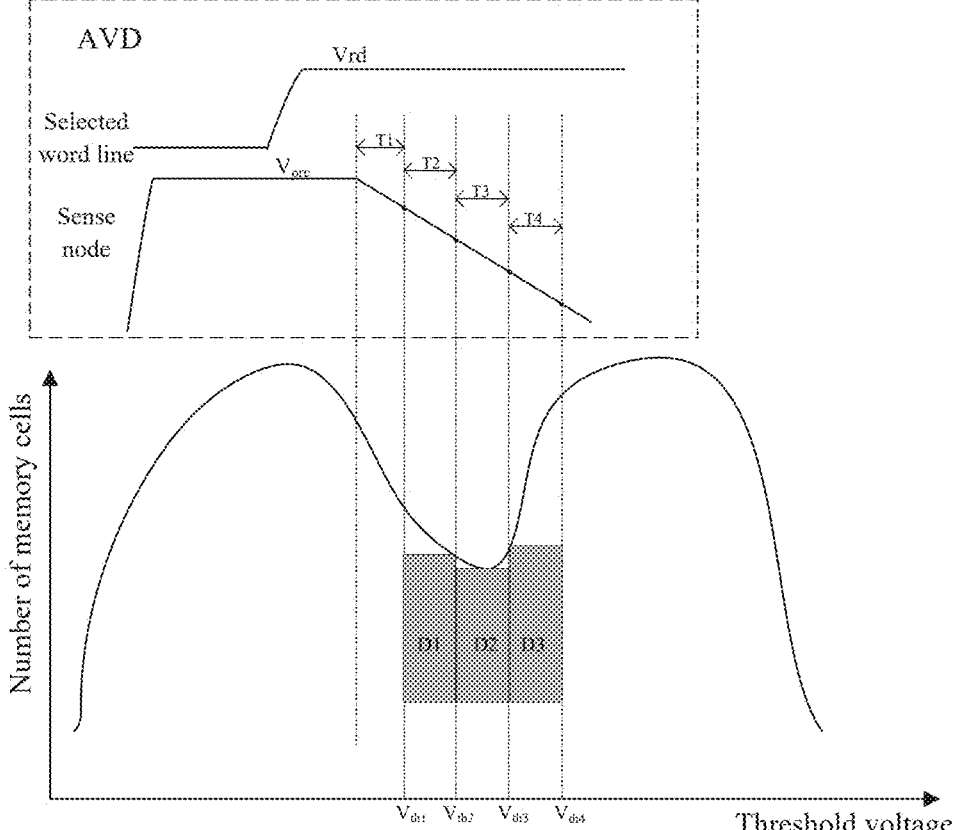
FIG. 4 is a schematic diagram of a method for detecting the valley value of the threshold voltage distribution using BL modulation provided in examples of the present disclosure.

FIG. 4 is a schematic diagram of a method for detecting the valley value of the threshold voltage distribution using BL modulation provided in examples of the present disclosure. As shown in FIG. 4, a read voltage Vrd is applied to the selected word line. After the sense node is charged to the preset voltage $V_{pre}$, the sense node is controlled to start discharging. For the first time, the sense node is controlled to start discharging from the preset voltage and stop after T1 time duration, and the number of memory cells that are on is counted as a first data. The first data indicates the number of memory cells with a threshold voltage less than the first threshold voltage $V_{th1}$. For the second time, the sense node is controlled to start discharging from the preset voltage and stop after (T1+T2) time duration, and the number of memory cells that are on is counted as a second data. The second data indicates the number of memory cells with a threshold voltage less than the second threshold voltage $V_{th2}$. The difference between the second data and the first data indicates the number of memory cells with a threshold voltage in the D1 threshold voltage interval (hereinafter referred to as the D1 interval). The upper limit value of the D1 interval is the second threshold voltage $V_{th2}$, and the lower limit value of the D1 interval is the first threshold voltage $V_{th1}$.

By analogy, the sense node is controlled to discharge from a preset voltage and then stop after a (T1+T2+T3) time duration, and the number of memory cells that are on is counted as a third data, wherein the third data indicates the number of memory cells with a threshold voltage less than the third threshold voltage $V_{th3}$, and the difference between the third data and the second data indicates the number of memory cells with a threshold voltage in the D2 threshold voltage interval (hereinafter referred to as the D2 interval). The sense node is controlled to discharge from a preset voltage and then stop after a (T1+T2+T3+T4) time duration, and the number of memory cells that are on is counted as a fourth data, wherein the fourth data indicates the number of memory cells with a threshold voltage less than the fourth threshold voltage $V_{th4}$, and the difference between the fourth data and the third data indicates the number of memory cells with a threshold voltage in the D3 threshold voltage interval (hereinafter referred to as the D3 interval).

The valley value of the threshold voltage distribution may be determined according to the number of memory cells in the D1 interval, the D2 interval, and the D3 interval. For example, if the number of memory cells in the D2 interval is less than the number of memory cells in the D1 interval and also less than the number of memory cells in the D3 interval, it is determined that the valley value is in the D2 interval. For another example, if the number of memory cells in the D1 interval, the D2 interval, and the D3 interval increases successively, it is determined that the valley value is in the D1 interval; or, the number of memory cells in the DO threshold voltage interval on the left side of the D1 interval is detected again, and the position of the valley value is determined by further combining the number of memory cells in the DO threshold voltage interval. For another example, if the number of memory cells in the D1 interval, the D2 interval, and the D3 interval decreases successively, it is determined that the valley value is in the D3 interval; or, the position of the valley value is determined by further combining the number of memory cells in the D4 threshold voltage interval on the right side of the D3 interval.

Figure 5:
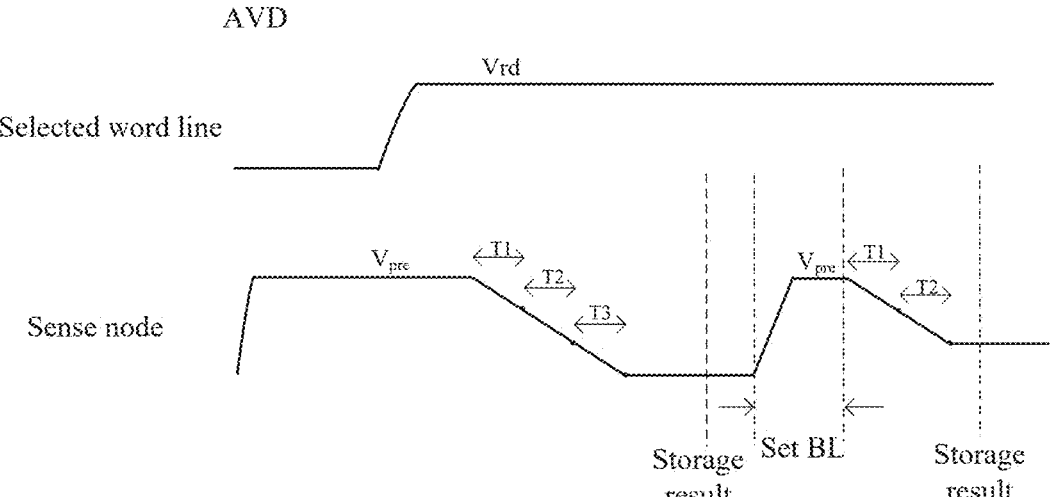
FIG. 5 is a schematic diagram of an AVD method provided in examples of the present disclosure.

FIG. 5 is a schematic flowchart of an AVD method provided in examples of the present disclosure. FIG. 5 illustrates by taking the determination of the number of memory cells in the D2 interval as an example. As shown in FIG. 5, a read voltage Vrd is applied to the selected word line, the sense node SO is charged to the preset voltage $V_{pre}$ for the first time, and then the sense node is controlled to perform the first discharge operation, wherein the discharge time duration is (T1+T2+T3). After the first discharge is completed, the result of the first discharge is stored. Afterwards, the sense node SO and the bit line are charged for the second time, that is, setting the bit line voltage in FIG. 5. Then the sense node is controlled to perform the second discharge operation, and the discharge time duration is (T1+T2). After the second discharge, the number of memory cells in the D2 interval may be obtained based on the results of the two discharges.

The operations of determining the number of memory cells in the D1 interval and the number of memory cells in the D3 interval are the same, and will not be repeated here. Although the method described above may determine the number of memory cells in the D1 interval, the D2 interval, and the D3 interval, this method may only determine the number of memory cells in one interval at a time, resulting in more threshold voltage intervals for determining the valley value and longer time consumption. Furthermore, before each discharge operation, it is required to charge the bit line and the sense node, which further prolongs the operation time and is not conducive to improving the working efficiency of the memory device.

Figure 6:
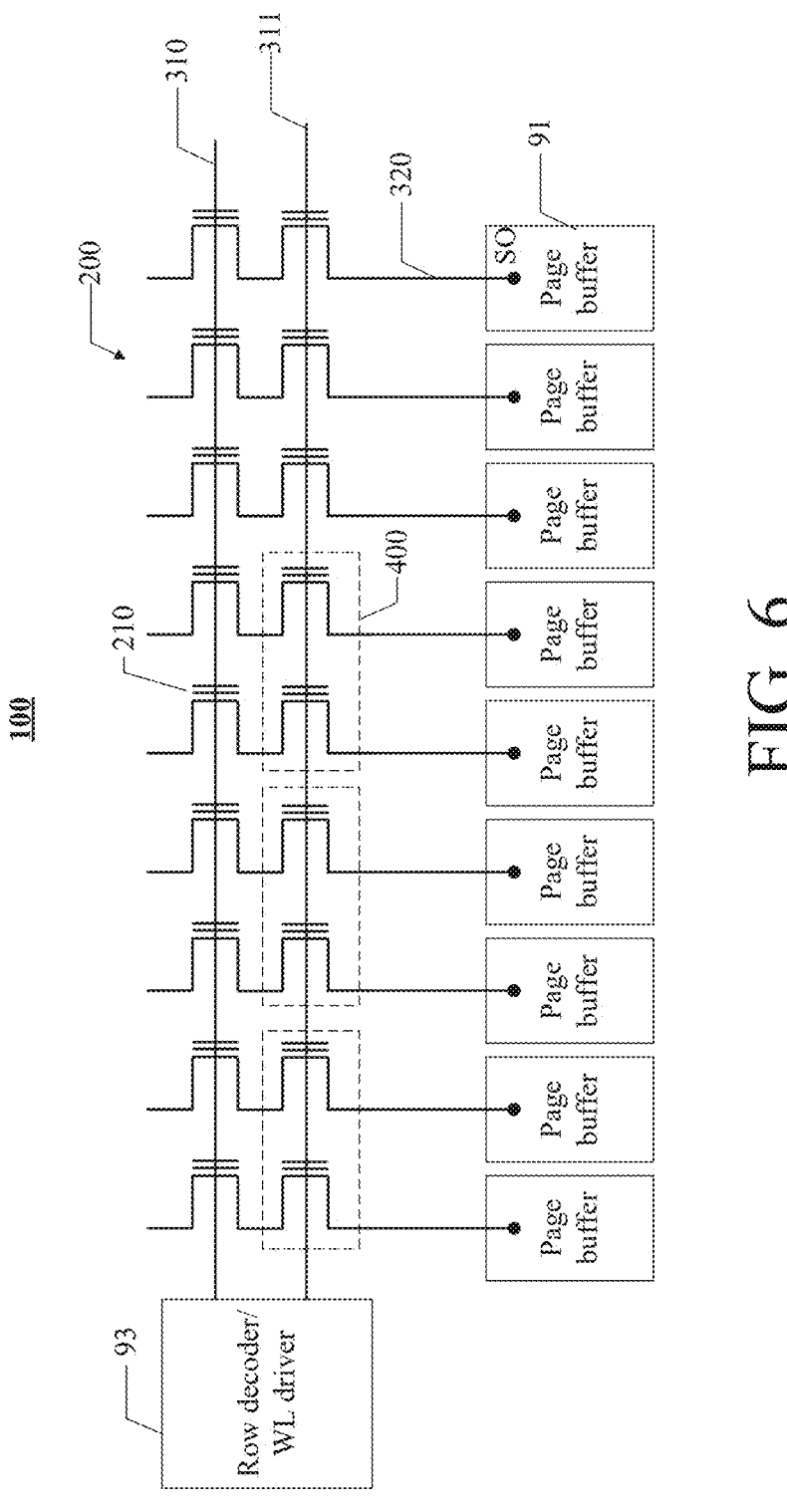
FIG. 6 is a schematic diagram of a memory device provided in examples of the present disclosure.

Examples of the present disclosure provide a memory device for performing the operating method provided in examples of the present disclosure to shorten the time for determining the valley value of the threshold voltage distribution employing the BL modulation method. FIG. 6 is a schematic diagram of a memory device provided in examples of the present disclosure. As shown in FIG. 6, the memory device 100 comprises a memory cell array 200, multiple word lines 310, multiple bit lines 320, and a peripheral circuit, wherein the memory cell array 200 comprises multiple memory cells 210, and the multiple word lines 310 and the multiple bit lines 320 are each coupled to the multiple memory cells. The peripheral circuit is coupled to the multiple word lines 310, and the peripheral circuit comprises a page buffer 91, wherein the sense node SO of the page buffer 91 is coupled to the bit line 320.

The peripheral circuit is configured to:

apply a first read voltage to a selected word line 311 among the multiple word lines 310;

charge the sense nodes SO corresponding to the memory cells 210 coupled to the selected word line 311;

divide the memory cells coupled to the selected word line 311 into multiple memory cell groups to perform sensing operations, wherein each memory cell group comprises multiple memory cells, and the sensing operation performed on each memory cell group comprises: controlling the multiple sense nodes corresponding to the multiple memory cells in the memory cell group to discharge twice, wherein a starting voltage of a second discharge is determined based on a first discharge, and discharge time durations of different memory cell groups are set differently; and obtain a first counted number of each memory cell group based on each discharge result of the multiple sense nodes corresponding to each memory cell group, wherein the discharge result of the sense nodes is related to a threshold voltage of the memory cell, and the first counted number is to indicate the number of memory cells, in the memory cell group, with a threshold voltage within a preset threshold voltage interval.

The peripheral circuit in this example may be the peripheral circuit 62 shown in FIG. 1F. For example, the row decoder/WL driver 93 in the peripheral circuit is configured to apply a first read voltage to the selected word line 311. The selected word line 311 is any one of the multiple word lines 310, in other words, any of the word lines may be used as the selected word line.

The peripheral circuit comprises multiple page buffers 91, each of which may be coupled to a bit line 320. In other words, multiple page buffers 91 and multiple bit lines 320 are connected one-to-one. The page buffer 91 may charge the sense node and perform a sensing operation. It is to be noted that FIG. 6 is only to illustrate the coupling method of the peripheral circuit and the memory cell array, and does not limit their actual positions.

The multiple memory cells 210 coupled to the selected word line are divided into multiple memory cell groups 400 to perform a sensing operation. If the memory cells 210 coupled to the selected word line are numbered sequentially, the numbers of the multiple memory cells in the memory cell group 400 may be continuous or discontinuous. Take dividing the memory cells with serial numbers 0 to 98 into three memory cell groups as an example for illustration. The continuous situation may be: the first memory cell group comprises memory cells with serial numbers 0 to 32, the second memory cell group comprises memory cells with serial numbers 33 to 65, and the third memory cell group comprises memory cells with serial numbers 66 to 98. The discontinuous situation may be: the first memory cell group comprises memory cells with serial numbers divided by 3 and the remainder is 0, the second memory cell group comprises memory cells with serial numbers divided by 3 and the remainder is 1, and the third memory cell group comprises memory cells with serial numbers divided by 3 and the remainder is 2. In general, the present disclosure does not restrict whether multiple memory cells 210 in a memory cell group 400 need to be adjacent, and may be specifically set according to actual needs.

For example, the number of memory cells 210 in each memory cell group of the multiple memory cell groups 400 is the same. That is, each memory cell group 400 comprises the same number of memory cells 210. In this way, when counting the number of memory cells in different threshold voltage intervals, the sample amount corresponding to each threshold voltage interval (i.e., the number of memory cells involved in the statistics) is the same, and the numbers of memory cells in different threshold voltage intervals may be directly compared, and the comparison method is simple. It is to be understood that the number of memory cells in multiple memory cell groups may not be exactly the same, and other parameters such as ratios (e.g., the ratio of memory cells being on to memory cells involved in statistics) may be employed for comparison. The number of memory cells in a memory cell group may be set according to actual needs.

For example, all memory cells coupled to the selected word line may be allowed to participate in the sensing operations, that is, all memory cells coupled to the selected word line may be divided into multiple memory cell groups to perform the sensing operations. For example, some memory cells coupled to the selected word line may also be allowed to participate in the sensing operations, that is, some memory cells are selected from all memory cells coupled to the selected word line, and these selected memory cells are divided into multiple memory cell groups to perform the sensing operations.

Multiple memory cell groups are respectively configured to determine the number of memory cells in multiple threshold voltage intervals. In examples of the present disclosure, all memory cells coupled to the selected word line may be divided into four memory cell groups, and three of the memory cell groups are selected to respectively determine the number of memory cells in interval D1, interval D2, and interval D3. The time periods for performing sensing operations on three memory cell groups may overlap. For example, sensing operations may be performed on three memory cell groups at the same time. In this way, the number of memory cells in multiple threshold voltage intervals may be determined in a same time period, thereby saving the operation time for determining the valley value.

Charging the sense nodes corresponding to the memory cells coupled to the selected word line to a preset voltage means charging at least the sense nodes corresponding to the memory cells to be subjected to the following sensing operation to a preset voltage. The time periods for performing the charging operation on the sense nodes corresponding to the memory cells of multiple memory cell groups may overlap. For example, the sense nodes corresponding to the multiple memory cell groups may be charged at the same time. In an example, the sense nodes corresponding to all of the memory cells coupled to the selected word line may be charged to a preset voltage at the same time, which may simplify the control scheme and will not produce negative effects.

In some examples, the peripheral circuit is further configured to charge the bit line coupled to the memory cells coupled to the selected word line. For example, the bit line is charged to a preset voltage. Charging the bit line may reduce the influence of the bit line voltage on the accuracy of the sensing result. The bit line and the sense node may be charged at the same time, that is, the bit line and the sense node are on during charging, so as to charge the both to the preset voltage at the same time. In another example, the bit line and the sense node may also be charged to a preset voltage, respectively. For example, the bit line and the sense node are disconnected, and the bit line and the sense node are charged to a preset voltage, respectively.

The present disclosure does not limit the operation of applying the first read voltage to the selected word line first or charging the sense node first. For example, the first read voltage may be applied to the selected word line first, and then the sense node may be charged to a preset voltage. For another example, the sense node may be charged to a preset voltage first, and then the first read voltage may be applied to the selected word line.

Figure 7:
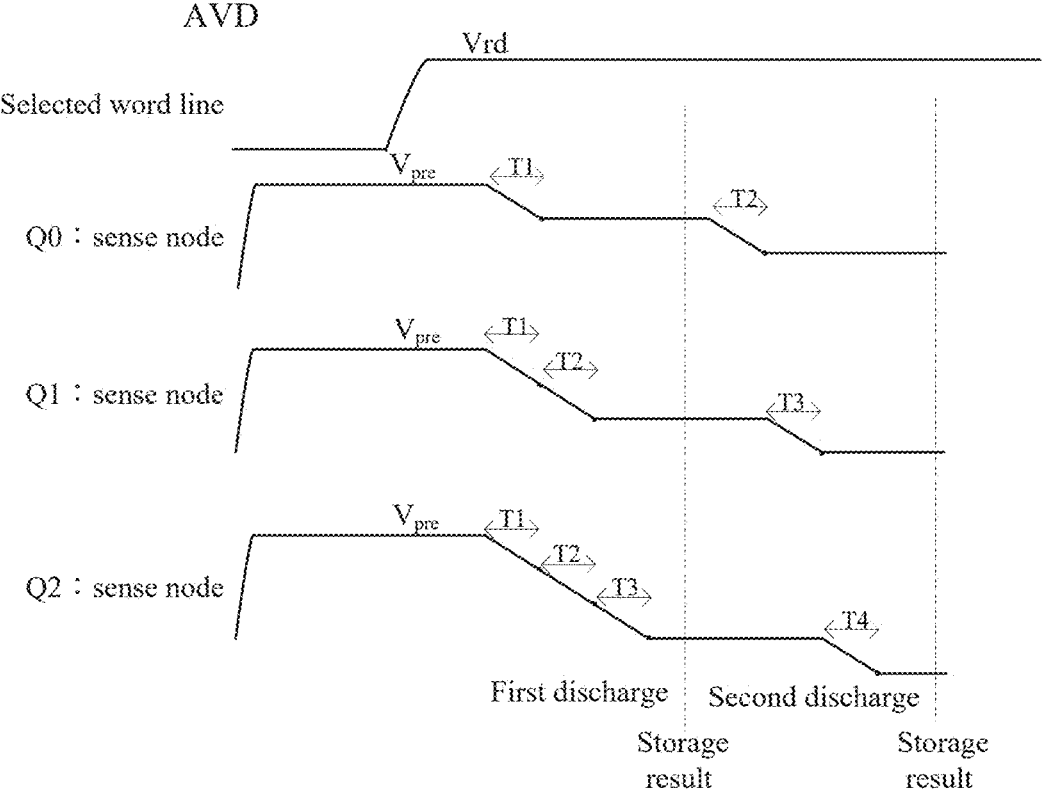
FIG. 7 is a schematic diagram of another AVD method provided in examples of the present disclosure.

FIG. 7 is a schematic flowchart of another AVD method provided in examples of the present disclosure, FIG. 7 shows the process of using the first memory cell group, the second memory cell group, and the third memory cell group to respectively determine the number of memory cells in the D1 interval, the D2 interval, and the D3 interval. Here, the numbers of the memory cell groups are only to distinguish different memory cell groups without limiting their positions. The following is an example of using the first memory cell group Q0 to determine the number of memory cells in the D1 interval. As shown in FIG. 7, after the sense node SO and the bit line are charged to the preset voltage $V_{pre}$ applied to the selected word line, the multiple sense nodes corresponding to the multiple memory cells in the first memory cell group Q0 are controlled to discharge for the first time, and the result is stored. Then, the sense node SO is controlled to directly discharge for the second time, and the result is stored. Before the second discharge, the sense node and bit line do not need to be charged again, rather the second discharge is continued on the basis of the first discharge. In other words, the starting voltage of the second discharge is determined based on the first discharge, which may reduce the time of one charge, shorten the total time of the AVD operation, and simplify the process of the AVD operation. In an example, it has been verified that reducing the time for charging once may shorten the entire AVD time by at least 8 us.

For example, the starting voltage of the second discharge is equal to the termination voltage of the first discharge. In combination with FIGS. 4 and 7, when the sense node is controlled to start the first discharge from the preset voltage $V_{pre}$, the number of memory cells with a threshold voltage less than the first threshold voltage $V_{th1}$ may be obtained, that is, the first data. The second discharge is performed by using the termination voltage after the first discharge as the starting voltage of the second discharge. Since the second discharge is performed on the basis of the first discharge, it is equivalent to discharging from the preset voltage $V_{pre}$ to the end of the second discharge, therefore, the number of memory cells with a threshold voltage less than the second threshold voltage $V_{th2}$ may be obtained, that is, the second data. The difference between the second data and the first data represents the number of memory cells with a threshold voltage in the D1 interval.

As shown in FIG. 7, the discharge time durations of different memory cell groups are set differently because different memory cell groups correspond to different threshold voltage intervals in FIG. 4. Different discharge time durations may be set for different memory cell groups based on different threshold voltage intervals.

In some examples, each memory cell group starts discharging from a preset voltage, wherein for different memory cell groups, the first discharge time durations are different, and the second discharge time durations are the same.

In this example, the second discharge time durations are the same, which may make the widths of the threshold voltage intervals of different memory cell groups the same, thus the position of the valley value may be determined by directly comparing the number of memory cells in different threshold voltage intervals, which is simpler and more efficient in operation and may shorten the AVD time. Here, the width of the threshold voltage interval refers to the difference between the upper limit value and the lower limit value of the threshold voltage interval. In some other examples, the widths of the threshold voltage intervals of different memory cell groups may not be exactly the same, at this point, it may not be possible to directly compare the number of memory cells in different threshold voltage intervals, instead it is required to employ normalization or other methods to convert them into the same threshold voltage interval for comparison.

It is to be noted that the second discharge time durations of different memory cell groups in the present disclosure are the same, and errors are allowed. That is, the second discharge time durations of different memory cell groups are the same within the error tolerance range.

The first discharge of different memory cell groups is to determine the lower limit value of the threshold voltage interval, and may also be considered to determine the position of the threshold voltage interval in the threshold voltage distribution. Therefore, the first discharge time durations for different memory cell groups are different, which may ensure that the threshold voltage intervals corresponding to different memory cell groups are different, so that the valley value of the threshold voltage time distribution may be determined by the number of memory cells in multiple threshold voltage intervals.

It is to be understood that, for a single memory cell group, the magnitude of the preset voltage will not affect the number of memory cells in the corresponding threshold voltage interval. Therefore, different memory cell groups may employ different preset voltages, and the memory cell group determines the number of memory cells in the corresponding threshold voltage interval by adjusting the first discharge time duration. However, in this example, charging all memory cell groups to the same preset voltage may simplify the operation, thereby improving the efficiency of AVD. Example of the present disclosure do not limit the magnitude of the preset voltage, and the magnitude of the preset voltage may be set according to actual needs.

In some examples, the different memory cell groups are sorted from short to long according to the first discharge time durations, wherein the first discharge time duration of the latter of two adjacent memory cell groups is equal to the sum of the first discharge time duration and the second discharge time duration of the former of the two adjacent memory cell groups.

Referring to FIGS. 4 and 7, after the different memory cell groups 400 are sorted from short to long according to the first discharge time durations, the first discharge time duration of the latter of two adjacent memory cell groups is longer and the lower limit value of the corresponding threshold voltage interval is larger. The first discharge time duration of the former of the two adjacent memory cell groups is shorter, and the lower limit value of the corresponding threshold voltage interval is smaller. The first discharge time duration of the latter is equal to the sum of the first discharge time duration and the second discharge time duration of the former, which is equivalent to the termination voltage after the first discharge of the latter being equal to the termination voltage after the second discharge of the former, which can also be understood as the starting voltage of the second discharge of the latter being equal to the termination voltage of the second discharge of the former. In this way, the boundaries of the threshold voltage intervals corresponding to these two may be overlapped. That is, the lower limit value of the threshold voltage interval corresponding to the latter is equal to the upper limit value of the threshold voltage interval corresponding to the former.

According to FIGS. 4 and 7, the first discharge time duration (T1+T2) of the second memory cell group Q1 is equal to the sum of the first discharge time duration T1 and the second discharge time duration T2 of the first memory cell group Q0, so that the lower limit value of the D2 interval coincides with the upper limit value of the D1 interval. The first discharge time duration (T1+T2+T3) of the third memory cell group Q2 is equal to the sum of the first discharge time duration (T1+T2+) and the second discharge time duration T3 of the second memory cell group Q1, so that the lower limit value of the D3 interval coincides with the upper limit value of the D2 interval.

It is to be understood that if the first discharge time duration of the second memory cell group Q1 is greater than the sum of the first discharge time duration and the second discharge time duration of the first memory cell group Q0, then the lower limit value of the D2 interval does not coincide with the upper limit value of the D1 interval. In an example, the lower limit value of the D2 interval is greater than the upper limit value of the D1 interval. If the first discharge time duration of the third memory cell group Q2 is greater than the sum of the first discharge time duration and the second discharge time duration of the second memory cell group Q1, the lower limit value of the D3 interval does not coincide with the upper limit value of the D2 interval. In an example, the lower limit value of the D3 interval is greater than the upper limit value of the D2 interval. This setting may also determine the valley value according to the number of memory cells in the D1 interval, the D2 interval and the D3 interval. However, in the scheme of FIG. 7, multiple threshold voltage intervals are set continuously and uninterruptedly, which may more accurately determine the position of the valley value.

It is to be noted that the first discharge time duration of the latter of the above two adjacent memory cell groups in the present disclosure is equal to the sum of the first discharge time duration and the second discharge time duration of the former of the two adjacent memory cell groups, and an error is allowed. That is, the first discharge time duration of the latter is approximately equal to the sum of the first discharge time duration and the second discharge time duration of the former.

In some examples, the first discharge time duration of the memory cell group comprises one or more unit time durations, and the second discharge time duration comprises one unit time duration. The first discharge time durations of multiple memory cell groups increase in steps by one unit time duration.

Referring back to FIGS. 4 and 7, the first discharge time duration of the memory cell group with a shortest first discharge time duration may comprise one unit time duration, and the second discharge time duration comprises one unit time duration. The first discharge time durations of other memory cell groups all comprise two or more unit time durations. The first discharge time durations of multiple memory cell groups are increased in steps by one unit time duration, so that the boundaries of the threshold voltage intervals corresponding to adjacent memory cell groups in the multiple memory cell groups sorted from short to long by the first discharge time durations overlap. For example, in FIG. 7, the first discharge time durations of the first memory cell group, the second memory cell group, and the third memory cell group comprise one, two, and three unit time durations (T), respectively, and their second discharge time durations all comprise one unit time duration, so that the boundaries of the D1 interval and the D2 interval overlap, and the boundaries of the D2 interval and the D3 interval overlap, that is, the threshold voltages corresponding to the D1 interval, the D2 interval, and the D3 interval are set continuously.

The following describes in detail how to use the page buffer to determine the number of memory cells in the threshold voltage interval.

In some examples, the peripheral circuit comprises multiple page buffers, and a sense node of each of the page buffers is coupled to a bit line, wherein each of the page buffers is configured to:

obtain a first value based on the first discharge result of the sense node, wherein the first value is to indicate whether the threshold voltage of the memory cell is less than the first preset threshold voltage;

obtain a second value based on the second discharge result of the sense node, wherein the second value is to indicate whether the threshold voltage of the memory cell is less than the second preset threshold voltage; and perform a logic operation on the first value and the second value to obtain a third value, wherein the third value indicates whether the threshold voltage of the memory cell is within the preset threshold voltage interval, and the preset threshold voltage interval is an interval less than the second preset threshold voltage and greater than or equal to the first preset threshold voltage.

The peripheral circuit further comprises: a control logic coupled to the page buffer and configured to: obtain a first counted number based on the multiple third values of the multiple memory cells.

In conjunction with FIG. 6, a memory cell group is taken as an example for illustration. Multiple memory cells 210 of the memory cell group 400 are coupled to the sense nodes SOs of the corresponding page buffers 91 through the bit lines 320. When performing the AVD operation, each sense node and the bit line coupled thereto are charged to a preset voltage, and the sense node is controlled to discharge for the first time through the bit line and the memory string. The page buffer 91 obtains a first value according to the first discharge result and stores the first value. The first value may be a logic value "0" or "1" to indicate whether the threshold voltage of the memory cell coupled to the page buffer is less than the first preset threshold voltage. For example, the first value "1" may indicate that the threshold voltage of the memory cell is less than the first preset threshold voltage, and the first value "0" may indicate that the threshold voltage of the memory cell is greater than or equal to the first preset threshold voltage. The reverse is also possible.

After the first value is stored, the sense node is controlled to discharge for the second time. The page buffer 91 obtains the second value according to the result of the second discharge, the second value may be a logic value "0" or "1" to indicate whether the threshold voltage of the memory cell coupled to the page buffer is less than the second preset threshold voltage. For example, the first value "1" may indicate that the threshold voltage of the memory cell is less than the second preset threshold voltage, and the first value "O" may indicate that the threshold voltage of the memory cell is greater than or equal to the second preset voltage. The reverse is also possible.

After obtaining the first value and the second value, the page buffer performs a logic operation on the first value and the second value to obtain a third value. The third value may be a logic value "0" or "1" to indicate whether the threshold voltage of the memory cell coupled to the page buffer is in the preset threshold voltage interval. In other words, the third value indicates that the threshold voltage of the memory cell is greater than or equal to the first preset threshold voltage and less than the second preset threshold voltage.

The present disclosure does not limit the content of the "logic operation". In an implementation, it may be set according to the relationship between the values of the first value, the second value and the third value and the indication content. In an implementation, the first value "O" indicates that the threshold voltage of the memory cell is less than the first preset voltage, and the second value "O" indicates that the threshold voltage of the memory cell is less than the second preset voltage. The logic operation may be an exclusive-OR operation, and accordingly, the third value "1" indicates that the threshold voltage of the memory cell is in the preset threshold voltage interval.

The control logic may obtain the third values in all page buffers corresponding to the memory cell group, and the first counted number may be obtained according to the values of the third values. Continuing with the above examples to discuss, the control logic counts the number of "1" in the third value output by all page buffers corresponding to the memory cell group to obtain the first counted number. Therefore, the first counted number may indicate the number of memory cells, in the memory cell group, with a threshold voltage within a preset threshold voltage interval.

In some examples, the implementation of the page buffer obtaining the first value according to the first discharge result may be as follows: comparing a first voltage of the sense node after the first discharge with a first reference voltage, and obtaining a first value based on the comparison result, wherein if the first voltage is less than the first reference voltage, it means that the memory cell is on, the threshold voltage of the memory cell is less than the first preset threshold voltage, and if the first voltage is greater than or equal to the first reference voltage, it means that the memory cell is off or is weakly on, the threshold voltage of the memory cell is greater than or equal to the first preset threshold voltage.

Similarly, the implementation of the page buffer obtaining the second value according to the second discharge result may be as follows: comparing a second voltage of the sense node after the second discharge with a second reference voltage, and obtaining a second value based on the comparison result, wherein if the second voltage is less than the second reference voltage, it means that the memory cell is on, the threshold voltage of the memory cell is less than the second preset threshold voltage, and if the second voltage is greater than or equal to the second reference voltage, it means that the memory cell is off or is weakly on, the threshold voltage of the memory cell is greater than or equal to the second preset threshold voltage.

For example, the second reference voltage is equal to the first reference voltage, and the two are collectively referred to as reference voltage. The reference voltage may be a trip voltage Vtrip in a read operation.

Figure 8:
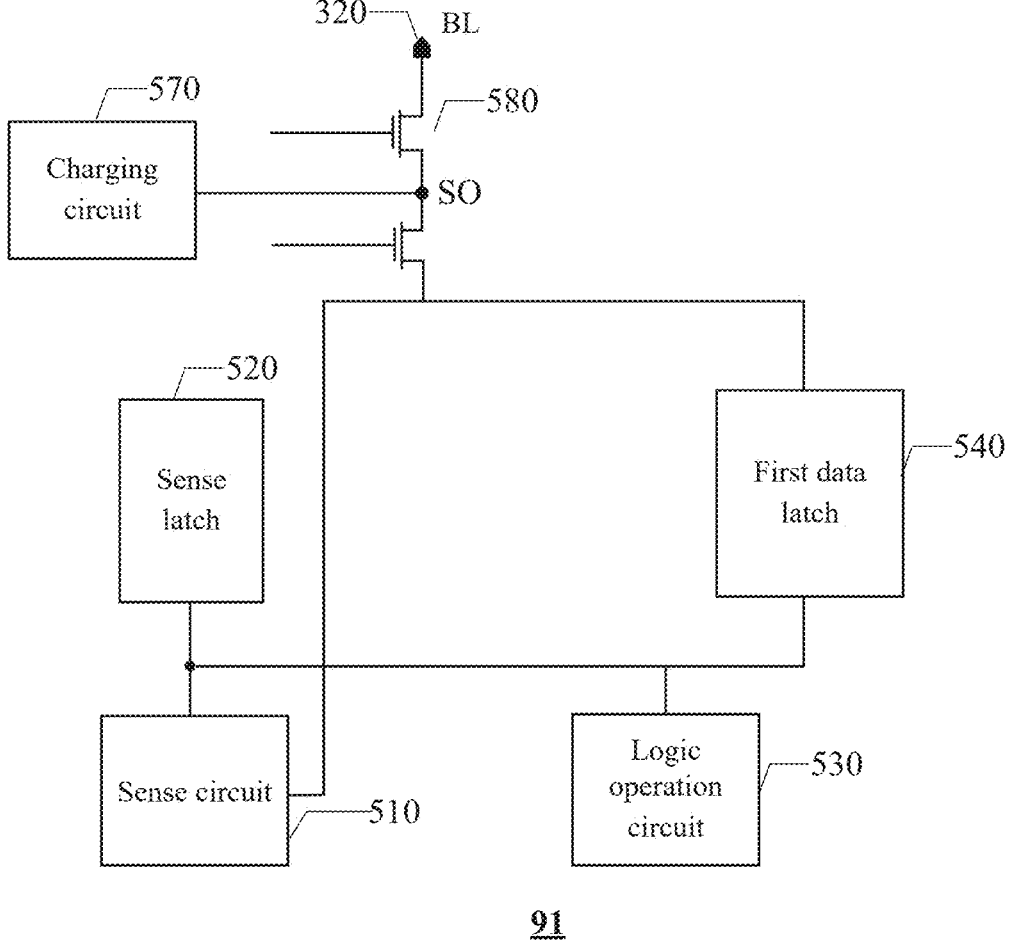
FIG. 8 is a schematic diagram of a page buffer provided in examples of the present disclosure.

Referring to FIG. 8, the page buffer comprises a sense circuit 510 coupled to a sense node SO. For example, the sense circuit 510 may comprise a MOS transistor, and the sense node SO is coupled to a gate of the MOS transistor. The reference voltage or the trip voltage may be a threshold voltage of the MOS transistor. Taking the MOS transistor being an NMOS transistor as an example, when the voltage of the sense node (the first voltage or the second voltage) is less than the threshold voltage of the NMOS transistor, the NMOS transistor is off, and the value sensed by the sense circuit (the first value or the second value) is "0". When the voltage of the sense node is greater than or equal to the threshold voltage of the NMOS transistor, the NMOS transistor is on, and the value sensed by the sense circuit is "1". It is to be understood that examples of the present disclosure do not limit the circuit structure of the sense circuit to compare the voltage of the sense node with the reference voltage and obtain the first value and the second value. Different designs may be employed in different examples.

In some examples, the page buffer 91 also comprises a sense latch (Sense D-Latch, DS) 520, a logic operation circuit 530 and a first data latch (No. 1 D-Latch, D1) 540, wherein the sense latch 520 is coupled to the sense circuit 510, the logic operation circuit 530 is coupled to the sense circuit 510 and the sense latch 520, and the first data latch 540 is coupled to the logic operation circuit 530. During the performance of the AVD operation, a configuration for the sense circuit 510, the sense latch 520, the logic operation circuit 530 and the first data latch 540 is as follows:

after the sense node discharges for the first time, the sense circuit 510 is configured to obtain the first value. The sense latch 520 is configured to receive the first value output by the sense circuit 510 and store the first value.

After the sense node discharges for the second time, the sense circuit 510 is configured to obtain the second value. The logic operation circuit 530 is configured to receive the second value output by the sense circuit 510 and obtain the third value by performing a logic operation based on the first value and the second value. The first data latch 540 is configured to receive the third value output by the logic operation circuit 530 and store the third value.

The present disclosure does not limit when the logic operation circuit obtains the first value, for example, the logic operation circuit 530 may receive the first value output by the sense latch 520 after the sense node discharges for the first time.

In some examples, the page buffers of different memory cell groups may be controlled separately. As shown in FIG. 7, the page buffer charges the sense nodes SO coupled to the multiple memory cell groups to the preset voltage $V_{pre}$ at the same time, and controls the sense nodes to start the first discharge at the same time. The second discharge of different memory cell groups may be performed at the same time or not. In FIG. 7, the second discharge of different memory cell groups is controlled separately, the second discharge of different memory cell groups is not performed at the same time, and the start time of the second discharge also depends on the end time of the first discharge. For example, the time durations for different memory cell groups to obtain the first value after the first discharge and store the first value may be approximately the same. In other words, the time durations from the end of the first discharge to the start of the second discharge of different memory cell groups may be approximately the same. As shown in FIG. 7, the time duration from the discharge T1 to the discharge T2 of the first memory cell group Q0 is approximately equal to the time duration from the discharge T2 to the discharge T3 of the second memory cell group Q1, which is approximately equal to the time duration from the discharge T3 to the discharge T4 of the third memory cell group. Then, the memory cell group that completes the first discharge first may first perform the second discharge after storing the result.

In some examples, the first discharge comprises a pre-discharge and a main discharge, wherein the pre-discharge time durations of different memory cell groups are the same, and the page buffer is configured to:

control the sense node to pre-discharge from a preset voltage, obtain the read value of the memory cell based on the pre-discharge result of the sense node; and control the sense node to perform main discharge, wherein the starting voltage of the main discharge is the termination voltage of the pre-discharge.

The read value of the memory cell refers to the data stored in the memory cell. The read value here may be a value of any one of the upper-order bit, the middle-order bit and the low-order bit, depending on which one of Vrd1 to Vrd7 the read voltage is. Controlling the sense node to pre-discharge from a preset voltage is essentially performing a conventional read operation, and the time duration of the pre-discharge is the sensing time duration in the read operation. After performing the read operation, the AVD operation is performed. In other words, examples of the present disclosure combine the read operation and the AVD operation in the same operation, which can reduce the time occupied by the AVD operation, thereby improving the working efficiency of the memory device.

Figure 9:
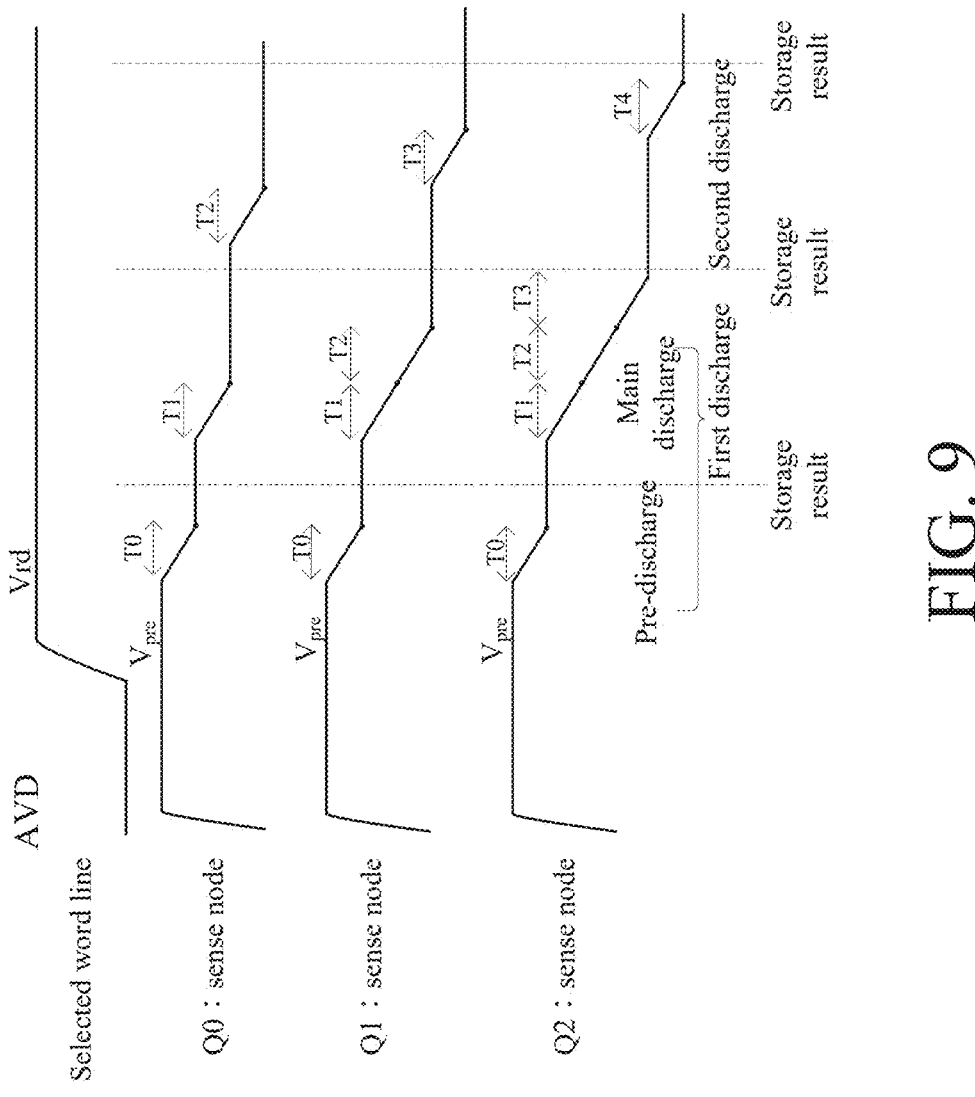
FIG. 9 is a schematic diagram of still another AVD method provided in examples of the present disclosure.

FIG. 9 is a schematic flowchart of another AVD method provided in examples of the present disclosure. The following is a detailed description of the operation method of combining the read operation and the AVD operation in a same operation. As shown in FIG. 9, the first discharge of the first memory cell group Q0, the second memory cell group Q1, and the third memory cell group Q2 all comprise pre-discharge and main discharge. For example, their pre-discharge time durations all comprise one unit time duration T.

For example, the pre-discharge operations for multiple memory cell groups are performed synchronously, that is, the sense nodes are synchronously controlled to start discharging from a preset voltage, and to stop discharging synchronously after a unit time duration. It is to be understood that all memory cells coupled to the selected word line need to be pre-discharged, comprising those memory cells that do not participate in the AVD operation, so that the read values in the memory cells can be determined. For example, all memory cells coupled to the selected word line are pre-discharged synchronously to obtain the read value of each memory cell.

After the pre-discharge, multiple memory cell groups start the main discharge. The main discharge time durations of different memory cell groups are different, so that their first discharge time durations are different. In this example, the main discharge time durations of the first memory cell group Q0, the second memory cell group Q1, and the third memory cell group Q2 are one unit time duration, two unit time durations, and three unit time durations, respectively. After the main discharge, the sense circuit may obtain the first value.

It is to be understood that since the main discharge is performed on the basis of the pre-discharge, the voltage of the sense node after the main discharge is equal to the voltage of the sense node after continuous discharge from the preset voltage for the pre-discharge time duration and the main discharge time duration, therefore, the pre-discharge does not affect the first value. The first value is still to indicate whether the threshold voltage of the memory cell is less than the first preset threshold voltage.

In some examples, as shown in FIG. 9, the time durations for different memory cell groups to obtain read values after pre-discharge and store read values may be approximately the same. In other words, the time durations from the end of the pre-discharge to the start of the main discharge of different memory cell groups may be approximately the same. The time durations for different memory cell groups to obtain the first value after the main discharge and store the first value may be approximately the same. In other words, the time durations from the end of the main discharge to the start of the second discharge of different memory cell groups may be approximately the same.

In the first discharge, the time duration of the main discharge may be 0. For example, the first discharge time duration of the memory cell group with the shortest first discharge time duration is equal to the pre-discharge time duration, and the main discharge time duration is 0. At this point, the read value and the first value may be determined based on the result of the pre-discharge.

Figure 10:
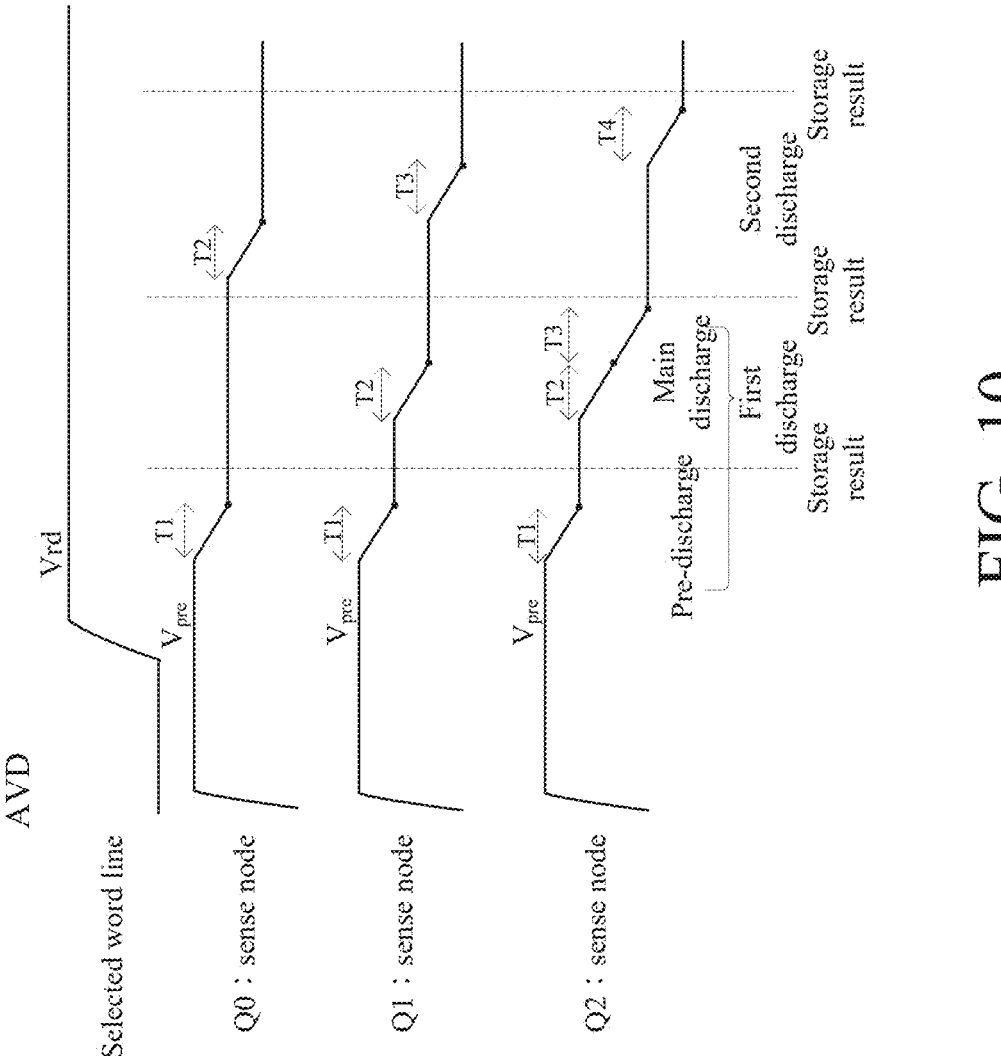
FIG. 10 is a schematic diagram of yet another AVD method provided in examples of the present disclosure.

FIG. 10 is a schematic flowchart of another AVD method provided in examples of the present disclosure. As shown in FIG. 10, the pre-discharge time duration of the first memory cell group Q0 is equal to the first discharge time duration T1, and the main discharge time duration is 0. The first memory cell group Q0 obtains the read value and the first value in the memory cell by pre-discharging, and the first value and the read value are the same. The pre-discharge time duration of the second memory cell group Q1 comprises a unit time duration T1, and the main discharge time duration comprises a unit time duration T2. The second memory cell group Q1 obtains the read value after pre-discharging, and obtains the first value after the main discharge. The pre-discharge time duration of the third memory cell group Q2 comprises a unit time duration T1, and the main discharge time duration comprises two unit time durations (T2+T3). The third memory cell group Q2 also obtains the read value after pre-discharging, and obtains the first value after the main discharge.

In this example, if another expression is used, and the pre-charge is not attributed to the first discharge, the expression may be: except for the memory cell group with the shortest first discharge time duration, other memory cell groups also comprise pre-discharge, the pre-discharge is performed before the first discharge, and the starting voltage of the first discharge is the termination voltage of the pre-discharge; the first discharge of the memory cell group with the shortest first discharge time duration also serves as its pre-discharge.

In some examples, as shown in FIG. 10, the time duration from the end of the pre-discharge to the start of the second discharge of the first memory cell group Q0 may be approximately equal to the sum of the time duration from the end of the pre-discharge to the start of the main discharge and the time duration from the end of the main discharge to the start of the second discharge of other memory cell groups (Q1, Q2). In other words, the time durations for different memory cell groups to obtain read values and store read values after pre-discharge may be approximately the same, and the time durations for obtaining the first value and storing the first value after main discharge (the main discharge time duration of the first memory cell group Q0 may be 0) may be approximately the same.

Figure 11:
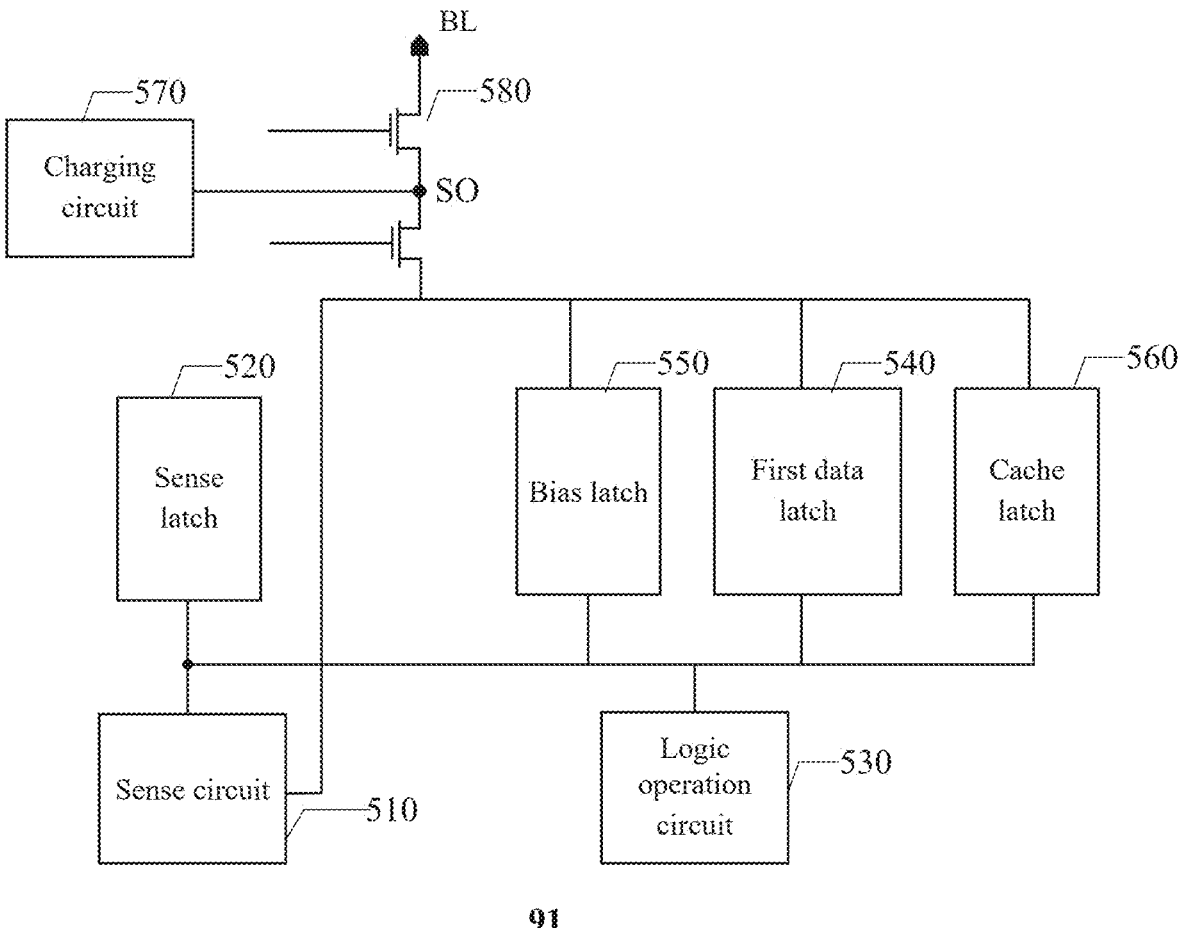
FIG. 11 is a schematic diagram of another page buffer provided in examples of the present disclosure.

In some examples, referring to FIG. 11, the page buffer 91 further comprises: a bias latch (DL) 550 and a cache latch (DC) 560, the bias latch 550 is coupled to the sense circuit 510, and the cache latch 560 is coupled to the bias latch 550. During the performance of the read operation and the AVD operation, a configuration for the sense circuit 510, the sense latch 520, the logic operation circuit 530, the first data latch 540, the bias latch 550 and the cache latch 560 is as follows:

After the sense node discharges for the second time, sense circuit 510 is configured to obtain the read value. The bias latch 550 is configured to receive the read value output by the sense circuit 510 and store the read value.

After the sense node performs main discharge, the sense circuit 510 is configured to obtain the first value. The sense latch 520 is configured to receive the first value output by the sense circuit 510 and store the first value.

After the sense node discharges for the second time, the sense circuit 510 is configured to obtain the second value. The logic operation circuit 530 is configured to receive the second value output by the sense circuit 510 and obtain the third value based on the first value and the second value. The first data latch 540 is configured to receive the third value output by the logic operation circuit and store the third value. The bias latch 550 is further configured to send the read value to the cache latch 560. The cache latch 560 is configured to store the read value.

Finally, after the read operation and the AVD operation are performed, the read value is stored in the cache latch 560, and the third value is stored in the first data latch 540.

In some examples, the page buffer 91 further comprises a sense control switch 580 coupled between the sense node SO and the bit line 320. The sense control switch 580 is configured to: control the sense node SO to be connected or disconnected with the bit line 320, wherein when the sense node SO is connected with the bit line 320, the sense node SO discharges, and when the sense node SO is disconnected with the bit line 320, the sense node SO stops discharging. During the period when the sense node SO stops discharging, the sense circuit 510 determines the state of the memory cell based on the discharge result.

In an example, during the power-off period after the pre-discharge of the sense node, the sense circuit determines the read value. During the power-off period after the main discharge of the sense node, the sense circuit determines the first value. During the power-off period after the second discharge of the sense node, the sense circuit determines the third value.

For example, the sense control switch comprises a MOS transistor, wherein the MOS transistor has a first end, a second end and a control end, the first end of the MOS transistor is connected to the bit line 320, the second end of the MOS transistor is connected to the sense node SO, and the control end of the MOS transistor is configured to receive a control signal. The sense control switch 580 is configured to: in response to the control signal, control the sense node to be connected or disconnected with the bit line to control the sense node to discharge or stop discharging. The gate end of the sense control switch 580 may be coupled to the control logic 95 in the peripheral circuit, and the control logic 95 sends a control signal to control the sense node to discharge or stop discharging.

Figure 12:
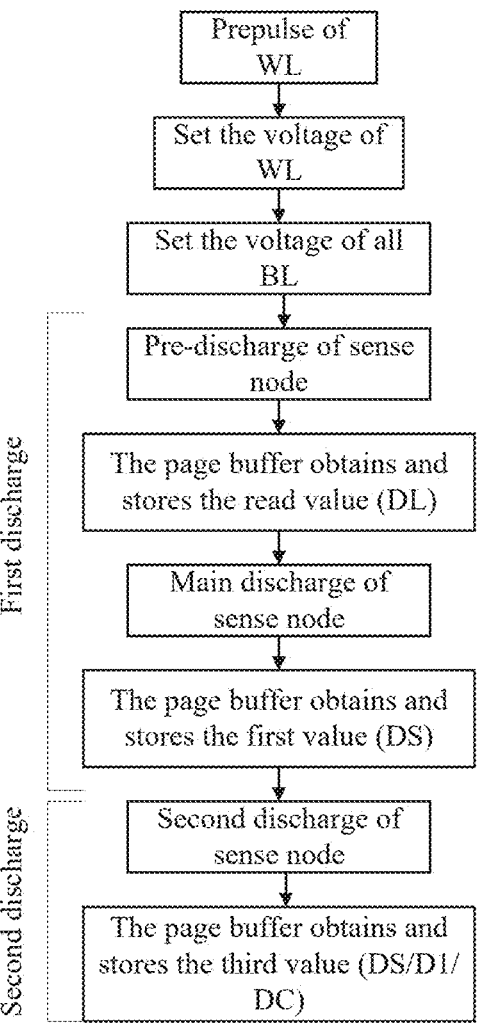
FIG. 12 is a schematic flow chart of an operating method for determining a valley value provided in examples of the present disclosure.

FIG. 12 is a schematic flow chart of an operating method for determining a valley value provided in examples of the present disclosure. The following is detailed description of the example shown in FIG. 12. As shown in FIG. 12, in the first operation, a prepulse is applied to the selected word line WL to increase the voltage of the selected word line before the read operation.

In the second operation, the voltage of the selected word line is set (WL setup). For example, a first read voltage is applied to the selected word line. The voltage setting of the selected word line in the first and second operations may be performed by the row decoder/WL driver 93 in the peripheral circuit.

In the third operation, the voltage of all bit lines is set (All BL Setup, ABL). The operation is: the bit lines and sense nodes corresponding to all memory cells coupled to the selected word line are charged to a preset voltage, wherein the bit lines and sense nodes may be charged synchronously or separately.

In the fourth operation, the sense node is controlled to be pre-discharged (sensing). In the third and fourth operations, the sense node SO may be charged by turning on the charging circuit 570. After being charged to a preset voltage, the charging circuit is disconnected, the sense node is connected to the bit line, and the sense node starts to discharge through the bit line. After a preset pre-discharge time duration, the sense node and the bit line are disconnected, so that the sense node stops discharging.

In the fifth operation, the page buffer (PB) obtains the read value and stores it (PB operation). In an example, during the period when the sense node stops discharging, the sense circuit compares the voltage of the sense node with the trip voltage, obtains the read value, and outputs it to the bias latch DL. The bias latch DL stores the read value.

In the sixth operation, the sense node is controlled to perform main discharge (sensing). In an example, the sense node and the bit line are connected for the second time, and the sense node continues to discharge on the basis of pre-discharge. After a preset main discharge time duration, the sense node is disconnected from the bit line, so that the sense node stops the second discharge. The first discharge time duration is equal to the sum of the main discharge time duration and the pre-discharge time duration.

In the seventh operation, the page buffer obtains and stores the first value (PB operation). In an example, during the period after the sense node stops discharging for the second time, the sense circuit compares the voltage of the sense node with the reference voltage, obtains the first value, and outputs it to the sense latch DS. The sense latch stores the first value.

In the eighth operation, the sense node is controlled to perform second discharge (sensing). In an example, the sense node and the bit line are connected for the third time, and the sense node continues the second discharge on the basis of pre-discharge. After a preset second discharge time duration, the sense node is disconnected from the bit line, so that the sense node stops the third discharge.

In the ninth operation, the page buffer obtains and stores the third value (PB operation). In an example, during the period after the sense node stops discharging for the third time, the sense circuit compares the voltage of the sense node with the reference voltage, obtains the second value, and outputs it to the logic operation circuit. The logic operation circuit, after obtaining the first value from the sense latch DS, obtains the third value based on the first value and the second value and outputs it to the first data latch D1. The first data latch D1 stores the third value. The bias latch DL outputs the read value to the cache latch DC, and the cache latch DC stores the read value.

It is to be noted that if the pre-discharge time duration of the memory cell group with the shortest first discharge time duration (e.g., the first memory cell group Q0 in FIG. 10) is equal to the first discharge time duration, the main discharge time duration is zero. Then, the sixth operation is omitted in the operation flow of the memory cell group with the shortest first discharge time duration. In the seventh operation, the sense circuit outputs the read value as the first value to the sense latch.

The control logic obtains the third value of multiple memory cells of the memory cell group and obtains a first counted number of the number of memory cells in the threshold voltage interval.

Since different memory cell groups synchronously perform the operations comprising the first to ninth operations described above, the control logic may simultaneously obtain multiple first counted numbers corresponding to multiple threshold voltage intervals between two adjacent threshold voltage distributions.

In some examples, the peripheral circuit is further configured to: correct, based on the multiple first counted numbers of the multiple memory cell groups, the sensing time duration in the read operation performed based on the first read voltage.

In the read operation, factors affecting the threshold voltage determination of the memory cell comprise the read voltage and the sensing time. Therefore, correcting the sensing time may improve the accuracy of the reading.

In this example, the operations of correcting, based on the multiple first counted numbers of the multiple memory cell groups, the sensing time duration in the read operation performed based on the first read voltage may be as follows: determining a threshold voltage interval to which the valley value threshold voltage belongs based on the first counted numbers of the multiple memory cell groups; and using a discharge time duration corresponding to the threshold voltage interval to which the valley voltage belongs as a corrected sensing time duration.

Combined with FIGS. 4 and 6, if the first counted number corresponding to the second memory cell group Q1 is less than the first counted number corresponding to the first memory cell group Q0 and the first counted number corresponding to the third memory cell group Q2, the D2 interval is determined to be the threshold voltage interval to which the valley value threshold voltage belongs. The amplification time duration corresponding to the D2 interval may be used as the corrected sensing time. Here, the D2 interval corresponds to a discharge time duration interval, e.g., in FIG. 4, the shortest discharge time duration corresponding to the D2 interval is 2 unit time durations (T1+T2), and the longest discharge time is 3 unit time durations (T1+T2+T3). A time duration may be selected from the discharge time duration interval as the corrected sensing time duration. For example, the corrected sensing time duration may be 2 unit time durations or 2.5 unit time durations. The present disclosure does not limit this.

It is to be noted that if the corrected sensing time duration is longer, it may affect the reading rate. At this point, the read voltage may be adjusted again, e.g., the read voltage may be increased, and the AVD operation method provided in examples of the present disclosure may be re-performed to determine a new sensing time duration. In other words, after obtaining the valley value between adjacent threshold distributions, adjustments may be made from two aspects, namely, the read voltage and the sensing time, to improve the accuracy of the read operation.

The memory cell may be configured to store multi-bit data. For example, a TLC memory cell is configured to store 3-bit data. The threshold voltage distribution of a memory with N-level storage comprises 2-1 valley values, where N is a positive integer. For example, the threshold voltage distribution of a TCL memory cell comprises 7 valley values. Therefore, for a memory cell storing multi-bit data, it is required to perform the above operation multiple times to determine multiple valley values of the memory cell.

In some examples, the peripheral circuit is further configured to: apply a second read voltage to the selected word line, wherein the second read voltage and the first read voltage are employed to determine the same bit data in the multi-bit data; apply a read inhibit voltage to part of the bit lines based on the read value of the memory cell at the first read voltage; charge the sense nodes coupled to the bit lines to which the read inhibit voltage is not applied; divide the memory cells coupled to the selected word line into multiple memory cell groups to perform sensing operations, so as to obtain a second counted number for each of the memory cell groups; and correct, based on the multiple second counted numbers of the multiple memory cell groups, the sensing time duration in the read operation performed based on the second read voltage.

The second read voltage is different from the first read voltage, the second read voltage and the first read voltage are to determine the same bit data in the multi-bit data. Taking the TLC memory cell as an example, the second read voltage and the first read voltage may be Vrd1 and Vrd5, which are to determine the low bit data. The second read voltage and the first read voltage may be any two of Vrd2, Vrd4 and Vrd6, which are to determine the middle bit data. The second read voltage and the first read voltage may be Vrd3 and Vrd7, which are to determine the upper bit data.

The operating method for determining the valley value as described above may be employed when determining any valley value. However, in this example, in order to reduce interference and improve the accuracy of the result, it is proposed that if the second read voltage and the first read voltage are to determine the same bit data in the multi-bit data, then a read inhibit voltage may be applied to part of the bit lines based on the read value of the memory cells at the first read voltage.

In an example, a read inhibit voltage is applied to the bit lines coupled to the memory cells that are on as indicated by the read values at the first read voltage. Take the first read voltage being Vrd1 and the second read voltage being Vrd5 as an example for explanation. If the read value of the memory cell at the first read voltage is 1, indicating that the memory cell is on, a read inhibit voltage is applied to the bit line corresponding to the memory cell. If the read value of the memory cell at the first read voltage is 0, indicating that the memory cell is off, a read inhibit voltage is not applied to the bit line corresponding to the memory cell.

Applying a read inhibit voltage to part of bit lines based on the read value at the first read voltage will not affect the determination of the second valley value, instead may improve the accuracy of the result. This is because if the memory cell may be on at the first read voltage and the second read voltage is greater than the first read voltage, the memory cell must be on at the second read voltage. Therefore, those memory cells that are on at the first read voltage are on the left side of the D1 interval corresponding to the second read voltage, which will not affect the number of memory cells in the D1 interval, D2 interval and D3 interval corresponding to the second read voltage, and therefore will not affect the determination of the second valley value.

The bit line to which the read prohibition voltage is not applied (e.g., the bit line coupled to the memory cell whose read value at the first read voltage indicates that it is off) is charged to a preset voltage, and the sense node coupled to the bit line to which the read prohibition voltage is not applied is charged to a preset voltage. In the sensing operation, the sense node coupled to the bit line to which the read prohibition voltage is not applied is controlled to discharge, so as to determine the second valley value by using the memory cell coupled to the bit line to which the read prohibition voltage is not applied.

It is to be noted that the sense node coupled to the bit line to which the read prohibition voltage is applied may be applied with the read inhibit voltage.

Then, the memory cells coupled to the selected word line are divided into multiple memory cell groups to perform the sensing operations, and the second counted number of each memory cell group are obtained. The present disclosure does not limit the grouping method. For example, the grouping method when performing the sensing operation at the second read voltage may be the same as the grouping method when performing the sensing operation at the first read voltage. The content of the sensing operation is the same as above and will not be repeated here.

Figure 13:
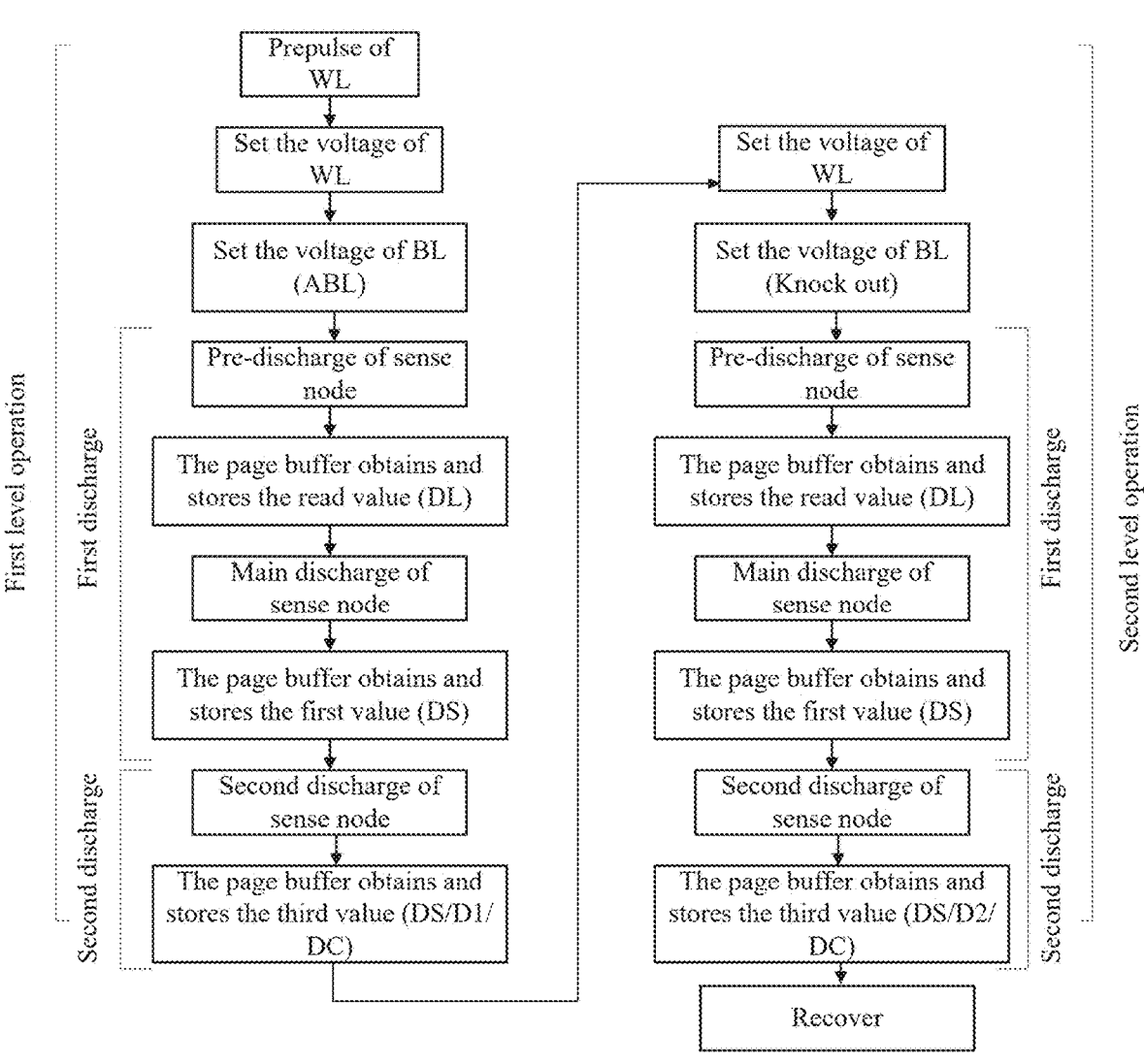
FIG. 13 is a schematic flow chart of another operating method for determining a valley value provided in examples of the present disclosure.

FIG. 13 is a schematic flow chart of another operating method for determining a valley value provided in examples of the present disclosure. The following is detailed description of the example shown in FIG. 13. In FIG. 13, the first to ninth operations are the same as those in FIG. 12, which will not be repeated here.

Referring to FIG. 13, in the tenth operation, the voltage of the selected word line WL is set (WL setup). For example, a second read voltage is applied to the selected word line. The voltage setting of the selected word line may be performed by the row decoder/WL driver 93 in the peripheral circuit.

In the eleventh operation, the voltage of the bit line is set based on the read value of the memory cell at the first read voltage (Knock out). In an example, if the read value of the memory cell indicates that it is on at the first read voltage, a read inhibit voltage is applied to the bit line coupled to the memory cell. If the read value of the memory cell indicates that it is off at the first read voltage, a preset voltage is applied to the bit line coupled to the memory cell.

The sense node coupled to the bit line to which the read inhibit voltage is not applied is charged to the preset voltage. Here, the bit line and the sense node may be charged synchronously.

In the twelfth operation, control the sense node to perform pre-discharge (sensing). In an example, after charging the sense node to a preset voltage, the charging circuit is disconnected, the sense node coupled to the bit line to which the read inhibit voltage is not applied is connected with the bit line, and the sense node begins to discharge through the bit line. After a preset pre-discharge time duration, the sense node and the bit line are disconnected, so that the sense node stops discharging.

In the thirteenth operation, the page buffer obtains and stores the read value (PB operation). In an example, during the period when the sense node stops discharging, the sense circuit compares the voltage of the sense node with the reference voltage, obtains the read value, and outputs it to the bias latch DL, wherein the bias latch stores the read value.

In the fourteenth operation, control the sense node to perform main discharge (sensing). In an example, the sense node and the bit line are connected for the second time, and the sense node continues to discharge on the basis of pre-discharge. After a preset main discharge time duration, the sense node is disconnected from the bit line, so that the sense node stops the second discharge. The first discharge time duration is equal to the sum of the main discharge time duration and the pre-discharge time duration.

In the fifteenth operation, the page buffer obtains and stores the first value (PB operation). In an example, during the period after the sense node stops discharging for the second time, the sense circuit compares the voltage of the sense node with the reference voltage, obtains the first value, and outputs it to the sense latch DS, wherein the sense latch stores the first value.

In the sixteenth operation, control the sense node to perform second discharge (sensing). In an example, the sense node and the bit line are connected for the third time, and the sense node continues the second discharge on the basis of pre-discharge. After a preset second discharge time duration, the sense node is disconnected from the bit line, so that the sense node stops the third discharge.

In the seventeenth operation, the page buffer obtains and stores the third value (PB operation). In an example, during the period after the sense node stops discharging for the third time, the sense circuit compares the voltage of the sense node with the reference voltage, obtains the second value, and outputs it to the logic operation circuit. The logic operation circuit, after obtaining the first value from the sense latch DS, obtains the third value based on the first value and the second value and outputs it to the second data latch D2. The second data latch D2 stores the third value at the second read voltage. The bias latch outputs the read value at the second read voltage to the cache latch DC, and the cache latch DC stores the read value at the second read voltage. In the eighteenth operation, recover.

Similarly, if the pre-discharge time duration of the memory cell group with the shortest first discharge time duration is equal to the first discharge time duration, the main discharge time duration is zero. Then, operation 14 is omitted in the operation flow of the memory cell group with the shortest first discharge time duration. In the fifteenth operation, the sense circuit outputs the read value as the first value to the sense latch.

In some examples, the peripheral circuit is further configured to: correct, based on the multiple second counted numbers of the multiple memory cell groups, the sensing time duration in the read operation performed based on the second read voltage. The example operating method may refer to the correction of the sensing time duration of the read operation performed at the first read voltage, which will not be repeated here.

In some examples, the peripheral circuit is configured to: determine multiple valley values in the threshold voltage distribution of the memory cell in a preset order, wherein the preset order is the order in which the peripheral circuit applies multiple read voltages to the selected word line, which is to determine the storage data in the memory cell. The advantage of this setting is that when performing the AVD operation, the peripheral circuit may also perform the operations of applying the read voltage in the AVD operation according to the order of applying the read voltage in the conventional read operation, so as to simplify the control scheme of the peripheral circuit, improve the overall working efficiency, and reduce redundant design.

The memory device provided by examples of the present disclosure divides the memory cells coupled to the selected word line into multiple memory cell groups to perform sensing operations, and the discharge time durations of the multiple memory cell groups are different to correspond to the number of memory cells determined for different threshold voltage intervals. Since the time periods for performing sensing operations on multiple memory cell groups may overlap, for example, sensing operations may be performed on multiple memory cell groups at the same time. In this way, the number of memory cells in multiple threshold voltage intervals may be determined in a same time period, thereby saving the operation time for determining the valley value.

In addition, when performing a sensing operation on a memory cell group, the sense node is charged once and then discharged twice, and the sense node does not need to be charged again before the second discharge, rather the second discharge is continued on the basis of the first discharge. In other words, the starting voltage of the second discharge is determined based on the first discharge, which may reduce the time of one charge, shorten the total time of the AVD operation, and simplify the process of the AVD operation.

Figure 14:
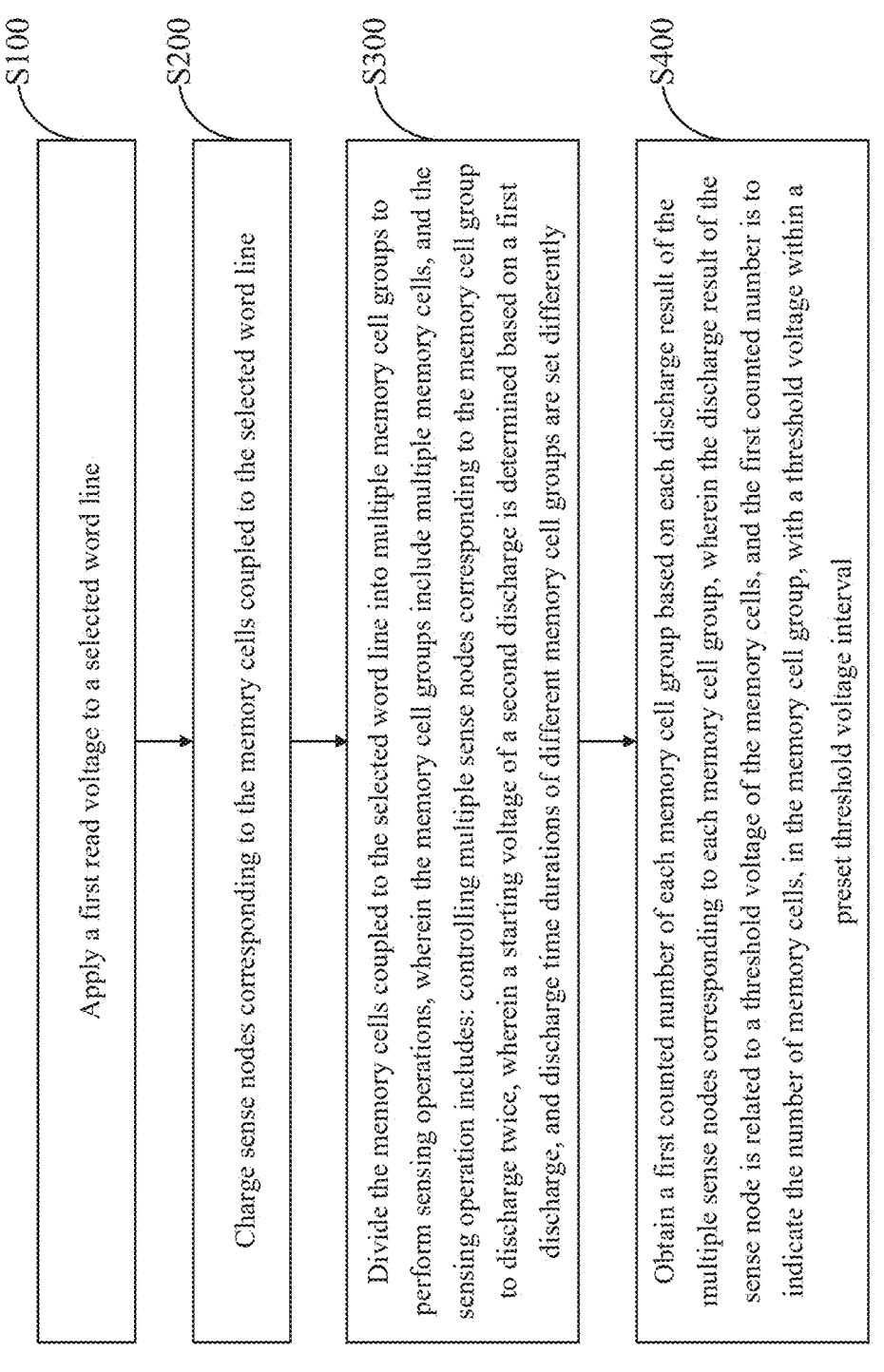
FIG. 14 is a schematic flowchart of an operating method for a memory device provided in examples of the present disclosure.

Examples of the present disclosure also provides an operating method for a memory device, wherein the memory device comprises a memory cell array and a peripheral circuit, the memory cell array comprises multiple memory cells, the word line and the bit line are coupled to the multiple memory cells, the peripheral circuit is coupled to the word line, the peripheral circuit comprises a page buffer, and a sense node of the page buffer is coupled to the bit line. FIG. 14 is a schematic flowchart of an operating method for a memory device provided in examples of the present disclosure, as shown in FIG. 14, comprising:

S100: applying a first read voltage to a selected word line;

S200: charging sense nodes corresponding to the memory cells coupled to the selected word line;

S300: dividing the memory cells coupled to the selected word line into multiple memory cell groups to perform sensing operations, wherein the memory cell groups comprise multiple memory cells, and the sensing operation comprises: controlling multiple sense nodes corresponding to the memory cell groups to discharge twice, wherein a starting voltage of a second discharge is determined based on a first discharge, and discharge time durations of different memory cell groups are set differently;

S400: obtaining a first counted number of each memory cell group based on each discharge result of the multiple sense nodes corresponding to each memory cell group, wherein the discharge result of the sense nodes is related to a threshold voltage of the memory cells, and the counted number is to indicate the number of memory cells, in the memory cell group, with a threshold voltage within a preset threshold voltage interval.

In some examples, the operating method further comprises: correcting, based on the multiple first counted numbers of the multiple memory cell groups, the sensing time duration in the read operation performed based on the first read voltage.

In some examples, operation S320, obtaining a first counted number of each memory cell group based on each discharge result of the multiple sense nodes corresponding to each memory cell group comprises: performing the following processing on the multiple sense nodes corresponding to each of the memory cell groups:

obtaining a first value based on the first discharge result of each sense node, wherein the first value is to indicate whether the threshold voltage of the memory cell is less than the first preset threshold voltage; obtaining a second value based on the second discharge result of each sense node, wherein the second value is to indicate whether the threshold voltage of the memory cell is less than the second preset threshold voltage; and performing a logic operation on the first value and the second value to obtain a third value, wherein the third value indicates whether the threshold voltage of the memory cell is within the preset threshold voltage interval, and the preset threshold voltage interval is an interval less than the second preset threshold voltage and greater than or equal to the first preset threshold voltage; and obtaining the first counted number based on the multiple third values of the multiple memory cells.

In some examples, the sense node is charged to a preset voltage, the first discharge comprises a pre-discharge and a main discharge, and the pre-discharge time durations of different memory cell groups are the same. Operation S310, controlling the multiple sense nodes corresponding to the memory cell group to perform a first discharge of two discharges comprising:

controlling the multiple sense nodes to perform the pre-discharge from the preset voltage; and controlling the multiple sense nodes to perform the main discharge after the pre-discharge, wherein the starting voltage of the main discharge is the termination voltage of the pre-discharge.

The operating method further comprises: obtaining the read value of the memory cell at the first read voltage based on the pre-discharge result of the sense node.

In some examples, the first discharge time duration of one of the multiple memory cell groups is equal to the pre-discharge time duration.

In some examples, the memory cell is configured to store multi-bit data; the operating method further comprises:

applying a second read voltage to the selected word line, wherein the second read voltage and the first read voltage are to determine the same bit data in the multi-bit data;

applying a read inhibit voltage to part of the bit lines based on the read value of the memory cell at the first read voltage;

charging sense nodes coupled to the bit lines to which the read inhibit voltage are not applied;

dividing the memory cells coupled to the selected word line into multiple memory cell groups to perform sensing operations, so as to obtain multiple second counted numbers for the multiple memory cell groups;

correcting, based on the multiple second counted numbers of the multiple memory cell groups, the sensing time duration in the read operation performed based on the second read voltage.

The operating method for a memory device provided by examples of the present disclosure divides the memory cells coupled to the selected word line into multiple memory cell groups to perform sensing operations, and the discharge time durations of the multiple memory cell groups are different to correspond to the number of memory cells determined for different threshold voltage intervals. Since the time periods for performing sensing operations on multiple memory cell groups may overlap, for example, sensing operations may be performed on multiple memory cell groups at the same time. In this way, the number of memory cells in multiple threshold voltage intervals may be determined in a same time period, thereby saving the operation time for determining the valley value. In addition, when performing a sensing operation on a memory cell group, the sense node is charged once and then discharged twice, and the sense node does not need to be charged again before the second discharge, rather the second discharge is continued on the basis of the first discharge. In other words, the starting voltage of the second discharge is determined based on the first discharge, which may reduce the time of one charge, shorten the total time of the AVD operation, and simplify the process of the AVD operation.

Regarding the methods in the examples described above, the example implementation of which has been described in detail in the example of the product corresponding to the method, and will not be described in detail here.

A memory system is further provided in examples of the present disclosure, the memory system comprises a memory device and a memory controller coupled to the memory device and configured to control the memory device, the memory device is any of the memory devices described above, and is configured to implement the operating method provided in the example of the present disclosure described above.

Examples of the present disclosure also provides an electronic device, comprising any of the memory systems described above, and is configured to implement the operating method provided in examples of the present disclosure described above.

In view of this, examples of the present disclosure provide a memory device and an operating method thereof, a memory system, and an electronic device.

According to a first aspect of the present disclosure, a memory device is provided, comprising:

a memory cell array comprising multiple memory cells;

word lines and bit lines coupled to the multiple memory cells;

a peripheral circuit coupled to the word lines and comprising a page buffer, wherein a sense node of the page buffer is coupled to the bit line, and the peripheral circuit is configured to:

apply a first read voltage to a selected word line;

charge sense nodes corresponding to the memory cells coupled to the selected word line;

divide the memory cells coupled to the selected word line into multiple memory cell groups to perform sensing operations, wherein the memory cell groups comprise multiple memory cells, and the sensing operation comprises: controlling the multiple sense nodes corresponding to the memory cell groups to discharge twice, wherein a starting voltage of a second discharge is determined based on a first discharge, and discharge time durations of different memory cell groups are set differently; and obtain a first counted number of each memory cell group based on each discharge result of the multiple sense nodes corresponding to each memory cell group, wherein the discharge result of the sense node is related to a threshold voltage of the memory cell, and the first counted number is to indicate the number of memory cells, in the memory cell group, with a threshold voltage within a preset threshold voltage interval.

According to a second aspect of the present disclosure, an operating method for a memory device is provided, wherein the memory device comprises a memory cell array, a word line, a bit line and a peripheral circuit, the memory cell array comprises multiple memory cells, the word line and the bit line are coupled to the multiple memory cells, the peripheral circuit is coupled to the word line and comprises a page buffer, and a sense node of the page buffer is coupled to the bit line; the operating method comprises:

applying a first read voltage to a selected word line;

charging the sense node corresponding to the memory cells coupled to the selected word line;

dividing the memory cells coupled to the selected word line into multiple memory cell groups to perform sensing operations, wherein the memory cell groups comprise multiple memory cells, and the sensing operation comprises: controlling the multiple sense nodes corresponding to the memory cell group to discharge twice, wherein a starting voltage of a second discharge is determined based on a first discharge, and discharge time durations of different memory cell groups are set differently;

obtaining a first counted number of each memory cell group based on each discharge result of the multiple sense nodes corresponding to each memory cell group, wherein the discharge result of the sense node is related to the threshold voltage of the memory cell, and the first counted number is to indicate the number of memory cells, in the memory cell group, with a threshold voltage within a preset threshold voltage interval.

According to a third aspect of the present disclosure, a memory system is provided, comprising: one or more memory devices as described in any one of the first aspect of the present disclosure;

a memory controller coupled to the memory device and configured to control the memory device.

According to a fourth aspect of the present disclosure, an electronic device is provided, comprising: a memory system as described in the third aspect of the present disclosure.

The memory device provided in examples of the present disclosure divides the memory cells coupled to the selected word line into multiple memory cell groups to perform sensing operations, and the discharge time durations of the multiple memory cell groups are different to correspond to the number of memory cells determined for different threshold voltage intervals. Since the time periods for performing sensing operations on the multiple memory cell groups may overlap, in an example, sensing operations may be performed on multiple memory cell groups at the same time. In this way, the number of memory cells in multiple threshold voltage intervals may be determined in a same time period, thereby saving the operation time duration for determining the valley value.

In addition, when performing a sensing operation on a memory cell group, the sense node is charged once and then discharged twice, and before the second discharge, the sense node does not need to be charged again, rather the second discharge is continued on the basis of the first discharge. In other words, the starting voltage of the second discharge is determined based on the first discharge, which may reduce the time duration of one charge, shorten the total time duration of the AVD operation, and simplify the process of the AVD operation.

The above is only implementations of the present disclosure, but the claimed scope of the present disclosure is not limited thereto, and changes or substitutions within the technical scope disclosed in the present disclosure that may be easily conceived by those skilled in the art shall fall within the claimed scope of the present disclosure.

What is claimed is:

1. A memory device, comprising:

a memory cell array including memory cells;

word lines and bit lines coupled to the memory cells;

a peripheral circuit coupled to the word lines and including a page buffer, wherein a sense node of the page buffer is coupled to the bit line, and the peripheral circuit is configured to:

apply a first read voltage to a selected word line;

charge sense nodes corresponding to the memory cells coupled to the selected word line;

divide the memory cells coupled to the selected word line into memory cell groups to perform sensing operations, wherein the memory cell groups include memory cells, and the sensing operation includes: controlling sense nodes corresponding to the memory cell groups to discharge twice, wherein a starting voltage of a second discharge is determined based on a first discharge, and discharge time durations of different memory cell groups are set differently; and obtain a first counted number of each memory cell group based on each discharge result of the sense nodes corresponding to each memory cell group, wherein the discharge result of the sense nodes is related to a threshold voltage of the memory cells, and the first counted number is to indicate the number of memory cells, in the memory cell group, with a threshold voltage within a preset threshold voltage interval.

2. The memory device of claim 1, wherein the starting voltage of the second discharge is a termination voltage of the first discharge.

3. The memory device of claim 1, wherein the peripheral circuit is further configured to:

correct, based on first counted numbers of the memory cell groups, a sensing time duration in a read operation performed based on the first read voltage.

4. The memory device of claim 1, wherein for different memory cell groups, first discharge time durations are different, and second discharge time durations are the same.

5. The memory device of claim 4, wherein the different memory cell groups are sorted from short to long according to the first discharge time durations, wherein a first discharge time duration of the latter of two adjacent memory cell groups is equal to a sum of the first discharge time duration and a second discharge time duration of the former of the two adjacent memory cell groups.

6. The memory device of claim 4, wherein a first discharge time duration of the memory cell group includes one or more unit time durations, and a second discharge time duration of the memory cell group includes one unit time duration, and the first discharge time durations of the memory cell groups increase in steps by one unit time duration.

7. The memory device of claim 1, wherein the number of memory cells in each of the memory cell groups is the same.

8. The memory device of claim 1, wherein the page buffer is configured to:

obtain a first value based on a first discharge result of the sense node, wherein the first value is to indicate whether the threshold voltage of the memory cell is less than a first preset threshold voltage;

obtain a second value based on a second discharge result of the sense node, wherein the second value is to indicate whether the threshold voltage of the memory cell is less than a second preset threshold voltage; and perform a logic operation on the first value and the second value to obtain a third value, wherein the third value indicates whether the threshold voltage of the memory cell is within the preset threshold voltage interval, and the preset threshold voltage interval is an interval less than the second preset threshold voltage and greater than or equal to the first preset threshold voltage; and the peripheral circuit further includes: a control logic coupled to the page buffer and configured to: obtain the first counted number based on third values of the memory cells.

9. The memory device of claim 8, wherein the page buffer is configured to:

compare a first voltage of the sense node after the first discharge with a reference voltage, and obtain a first value, wherein if the first voltage is less than the reference voltage, the threshold voltage of the memory cell is less than the first preset threshold voltage; and compare a second voltage of the sense node after the second discharge with the reference voltage, and obtain a second value, wherein if the second voltage is less than the reference voltage, the threshold voltage of the memory cell is less than the second preset threshold voltage.

10. The memory device of claim 8, wherein the page buffer includes: a sense circuit, a sense latch, a logic operation circuit and a first data latch, wherein the sense circuit is coupled to the sense node, the sense latch is coupled to the sense circuit, the logic operation circuit is coupled to the sense circuit and the sense latch, and the first data latch is coupled to the logic operation circuit;

after the sense node discharges for a first time, the sense circuit is configured to obtain the first value;

the sense latch is configured to store the first value;

after the sense node discharges for a second time, the sense circuit is configured to obtain the second value;

the logic operation circuit is configured to obtain the first value and the second value, and obtain the third value based on the first value and the second value; and the first data latch is configured to store the third value.

11. The memory device of claim 1, wherein the sense node is charged to a preset voltage, the first discharge includes a pre-discharge and a main discharge, and pre-discharge time durations of different memory cell groups are the same; and

32 the page buffer is configured to:

control the sense node to perform the pre-discharge from the preset voltage;

obtain a read value of the memory cell based on a pre-discharge result of the sense node; and control the sense node to perform the main discharge, wherein the starting voltage of the main discharge is a termination voltage of the pre-discharge.

12. The memory device of claim 11, wherein a first discharge time duration of one of the memory cell groups is equal to the pre-discharge time duration.

13. The memory device of claim 11, wherein the page buffer includes: a sense circuit, a bias latch and a cache latch, wherein the sense circuit is coupled to the sense node, the bias latch is coupled to the sense circuit, and the cache latch is coupled to the bias latch;

after the sense node is pre-discharged, the sense circuit is configured to obtain the read value, and the bias latch is configured to store the read value;

after the sense node discharges for a second time, the bias latch is further configured to send the read value to the cache latch; and the cache latch is configured to store the read value.

14. The memory device of claim 1, wherein the page buffer includes: a sense control switch coupled between the sense node and the bit line and configured to: control the sense node to be connected or disconnected with the bit line, wherein, the sense node discharges when the sense node is connected with the bit line.

15. The memory device of claim 1, wherein the memory cell is used to store multi-bit data, and the peripheral circuit is further configured to:

apply a second read voltage to the selected word line, wherein the second read voltage and the first read voltage are employed to determine the same bit data in the multi-bit data;

apply a read inhibit voltage to part of the bit lines based on a read value of the memory cell at the first read voltage;

charge the sense nodes coupled to the bit lines to which the read inhibit voltage is not applied;

divide the memory cells coupled to the selected word line into memory cell groups to perform sensing operations, to obtain a second counted number for each memory cell group; and correcting, based on second counted numbers of the memory cell groups, a sensing time duration in a read operation performed based on the second read voltage.

16. An operating method for a memory device, wherein the memory device includes a memory cell array, word lines, bit lines and a peripheral circuit, the memory cell array includes memory cells, the word lines and the bit lines are coupled to the memory cells, the peripheral circuit is coupled to the word lines and includes a page buffer, a sense node of the page buffer is coupled to the bit line, and the operating method comprising:

applying a first read voltage to a selected word line;

charging sense nodes corresponding to the memory cells coupled to the selected word line;

dividing the memory cells coupled to the selected word line into memory cell groups to perform sensing operations, wherein the memory cell groups include memory cells, and the sensing operation includes: controlling sense nodes corresponding to the memory cell groups to discharge twice, wherein a starting voltage of a second discharge is determined based on a first discharge, and discharge time durations of different memory cell groups are set differently; and obtaining a first counted number of each memory cell group based on each discharge result of the sense nodes corresponding to each memory cell group, wherein the discharge result of the sense nodes is related to a threshold voltage of the memory cells, and the first counted number is to indicate the number of memory cells, in the memory cell group, with a threshold voltage within a preset threshold voltage interval.

17. The operating method for a memory device of claim 16, wherein the operating method further includes:

correcting, based on first counted numbers of the memory cell groups, a sensing time duration in a read operation performed based on the first read voltage.

18. The operating method for a memory device of claim 16, wherein obtaining a first counted number of each memory cell group based on each discharge result of the sense nodes corresponding to each memory cell group includes: performing the following processing on the sense nodes corresponding to each memory cell groups:

obtaining a first value based on a first discharge result of each sense node, wherein the first value is to indicate whether the threshold voltage of the memory cell is less than a first preset threshold voltage;

obtaining a second value based on a second discharge result of each sense node, wherein the second value is to indicate whether the threshold voltage of the memory cell is less than a second preset threshold voltage;

performing a logic operation on the first value and the second value to obtain a third value, wherein the third value indicates whether the threshold voltage of the memory cell is within the preset threshold voltage interval, and the preset threshold voltage interval is an interval less than the second preset threshold voltage and greater than or equal to the first preset threshold voltage; and obtaining the first counted number based on third values of the memory cells.

19. The operating method for a memory device of claim 16, wherein the sense node is charged to a preset voltage, the first discharge includes a pre-discharge and a main discharge, pre-discharge time durations of different memory cell groups are the same, and the controlling the sense nodes corresponding to the memory cell group to perform a first discharge of two discharges includes:

controlling the sense nodes to perform the pre-discharge from the preset voltage;

controlling the sense nodes to perform the main discharge after the pre-discharge, wherein the starting voltage of the main discharge is a termination voltage of the pre-discharge; and the operating method further including: obtaining a read value of the memory cell at the first read voltage based on a pre-discharge result of the sense node.

20. A memory system, comprising:

one or more memory devices, including:

a memory cell array including memory cells;

word lines and bit lines coupled to the memory cells;

a peripheral circuit coupled to the word lines and including a page buffer, wherein a sense node of the page buffer is coupled to the bit line, and the peripheral circuit is configured to:

apply a first read voltage to a selected word line;

charge sense nodes corresponding to the memory cells coupled to the selected word line;

divide the memory cells coupled to the selected word line into memory cell groups to perform sensing operations, wherein the memory cell groups include memory cells, and the sensing operation includes: controlling sense nodes corresponding to the memory cell groups to discharge twice, wherein a starting voltage of a second discharge is determined based on a first discharge, and discharge time durations of different memory cell groups are set differently;

obtain a first counted number of each memory cell group based on each discharge result of the sense nodes corresponding to each memory cell group, wherein the discharge result of the sense nodes is related to a threshold voltage of the memory cells, and the first counted number is to indicate the number of memory cells, in the memory cell group, with a threshold voltage within a preset threshold voltage interval; and a memory controller coupled to the memory device and configured to control the memory device.

* * * * *